(12) United States Patent
Cai et al.

(10) Patent No.: US 8,927,364 B2
(45) Date of Patent: Jan. 6, 2015

(54) STRUCTURE AND METHOD OF HIGH-PERFORMANCE EXTREMELY THIN SILICON ON INSULATOR COMPLEMENTARY METAL—OXIDE—SEMICONDUCTOR TRANSISTORS WITH DUAL STRESS BURIED INSULATORS

(75) Inventors: Ming Cai, Hopewell Junction, NY (US); Dechao Guo, Yorktown Heights, NY (US); Liyang Song, Wappingers Falls, NY (US); Chun-Chen Yeh, Clifton Park, NY (US)

(73) Assignee: International Business Machines Corporation, Armonk, NY (US)

(*) Notice: Subject to any disclaimer, the term of this patent is extended or adjusted under 35 U.S.C. 154(b) by 170 days.

(21) Appl. No.: 13/443,133

(22) Filed: Apr. 10, 2012

(65) Prior Publication Data
US 2013/0264653 A1    Oct. 10, 2013

(51) Int. Cl.
*H01L 21/8238*    (2006.01)
(52) U.S. Cl.
USPC .......................................... 438/229; 257/369
(58) Field of Classification Search
CPC .................. H01L 21/823878; H01L 27/1203; H01L 21/823807; H01L 27/1207; H01L 21/84
USPC .......................................... 438/229; 257/369
See application file for complete search history.

(56) References Cited

U.S. PATENT DOCUMENTS

| | | | |
|---|---|---|---|
| 7,271,442 B2 | 9/2007 | Yang et al. | |
| 7,521,763 B2 | 4/2009 | Kim et al. | |
| 7,560,328 B2 | 7/2009 | Chidambarrao et al. | |
| 7,569,892 B2 | 8/2009 | Zhu et al. | |
| 2006/0151833 A1* | 7/2006 | Yang et al. | 257/347 |
| 2009/0032874 A1* | 2/2009 | Loubet et al. | 257/350 |
| 2009/0152638 A1 | 6/2009 | Belyansky et al. | |
| 2011/0254092 A1* | 10/2011 | Yang et al. | 257/351 |
| 2011/0309446 A1* | 12/2011 | Doris et al. | 257/351 |
| 2012/0292637 A1* | 11/2012 | Beyer et al. | 257/77 |

OTHER PUBLICATIONS

S. Monfray et al., "Localized SOI technology: an Innovative Low Cost Self-Aligned Process for Ultra Thin Si-Film on Thin BOX Integration for Low Power Applications," IEEE Electron Devices Meeting, Dec. 10-12, 2007, pp. 693-696.

D. Dutarte et al., "Si/SiGe Epitaxy: a Ubiquitous Process for Advanced Electronics," IEEE Electron Devices Meeting, Dec. 10-12, 2007, pp. 689-692.

(Continued)

*Primary Examiner* — Jarrett Stark
*Assistant Examiner* — Mohammad M Hoque
(74) *Attorney, Agent, or Firm* — Derrick J. Carman

(57) ABSTRACT

A method of forming a complementary metal oxide semiconductor (CMOS) device including an n-type field effect transistor (NFET) and an p-type field effect transistor (PFET) having fully silicided gates electrode in which an improved dual stress buried insulator is employed to incorporate and advantageous mechanical stress into the device channel of the NFET and PFET. The method can be imposed on a bulk substrate or extremely thin silicon on insulator (ETSOI) substrate. The device includes a semiconductor substrate, a plurality of shallow trench isolations structures formed in the ETSOI layer, NFET having a source and drain region and a gate formation, a PFET having a source and drain region, and a gate formation, an insulator layer, including a stressed oxide or nitride, deposited inside the substrate of the NFET, and a second insulator layer, including either an stressed oxide or nitride, deposited inside the substrate of the PFET.

3 Claims, 21 Drawing Sheets

(56) References Cited

OTHER PUBLICATIONS

S. Monfray et al., "Silicon-On-Nothing (SON) Applications for Low Power Technologies," IEEE International Conference on Integrated Circuit Design and Technology and Tutorial,, Jun. 2-4, 2008, pp. 693-696.

J.-L. Huguenin et al., "Localized SOI Logic and Bulk I/O Devices Co-Integration for Low power System-on-Chip Technology," VLSI Technology Systems and Applications (VLSI-TSA 2010), Apr. 26-28, 2010.

J.-L. Huguenin et al., "Hybrid Localized SOI/bulk technology for low power system-on-chip," Symposium on VLSI Technology (VLSIT 2010), Jun. 15-17, 2010.

* cited by examiner

STRUCTURE AND METHOD OF HIGH-PERFORMANCE EXTREMELY THIN SILICON ON INSULATOR COMPLEMENTARY METAL—OXIDE—SEMICONDUCTOR TRANSISTORS WITH DUAL STRESS BURIED INSULATORS

FIELD OF INVENTION

The present invention relates to a semiconductor structure and a method of fabricating the same. More particularly, the present invention relates to a complementary metal oxide semiconductor (CMOS) structure including an n-type field effect transistor (NFET) and an p-type field effect transistor (PFET) having fully silicided gates electrode in which an improved dual stress buried insulator is employed to incorporate and advantageous mechanical stress into the device channel of the NFET and PFET.

BACKGROUND OF THE INVENTION

Silicon-on-insulator (SOI) technology is an enhanced silicon technology currently being utilized to increase the performance of digital logic circuits. By utilizing SOI technology, designers can increase the speed of digital logic integrated circuits or can reduce their overall power consumption. The advances in technology will lead to the development of more complex and faster computer integrated circuits that operate with less power.

Complementary metal oxide semiconductor (CMOS) field effect transistors (FETs) are employed in almost every electronic circuit application including, for example, signal processing, computing, and wireless communications. As transistor devices continue to scale, a reduction in FET gate size has also led to a decrease in thickness of the SOI layer in order to control short channel effects. In fact, the so-called extremely thin SOI or ETSOI devices can have SOI thickness on the order of about 10 nanometers (nm) or less.

Within the technology of complementary metal oxide semiconductor (CMOS) transistors, dual stress liners have been used to improve both N-type and P-type transistor performance. The carrier mobility in a transistor can be increased when a stress of sufficient magnitude is applied to the conduction channel of a transistor to create a strain therein. An increase in the performance of an n-type field effect transistor NFET can be achieved by applying a tensile longitudinal stress of the conduction channel of the NFET. An increase in the performance of a p-type field effect transistor (PFET) can be achieved by applying a compressive longitudinal stress to the conduction channel of the PFET.

On SOI wafers, stress effect from the buried on oxide layer (BOX) is usually not an issue since the stress will drop to a negligible level at the channel to the silicon thickness on the BOX layer. However, on ETSOI wafers, the stress effect from the BOX can have an impact on the transistors on top due to the extremely thin silicon layer. This allows for stress engineering on buried insulators to enhance CMOS performance.

The invention uses existing silicon-on-nothing (SON) techniques to create an ETSOI wafer structure with dual stress buried insulators. SON have air-gaps under channel regions. With the air-gaps, the short channel effect of the SON is improved, and leakage currents can be reduced. One conventional process includes forming a silicon germanium (SiGe) layer on a silicon substrate, forming a silicon layer on the SiGe layer, forming a gate over the silicon layer, forming source and drain recesses, and etching the silicon germanium layer to form the air-gap. This can be accomplished by a variety of embodiments as will be disclosed further.

SUMMARY OF THE INVENTION

In consideration of the foregoing, the present invention provides methods and an apparatus of high performance extremely thin silicon on insulator complementary metal-oxide-semiconductor transistors with dual stress buried insulators.

In a first aspect of the invention, a semiconductor device is provided. The semiconductor device includes a bulk substrate, a silicon layer deposited on top of the bulk substrate, a plurality of shallow trench isolations structures formed in the bulk substrate for isolating active areas for forming an NFET device and PFET for forming a gate channel region for respective NFET and PFET device, a NFET having a source region, a drain region, and a gate formation, a PFET having a source region, a drain region, and a gate formation, an insulator layer, including a stressed oxide or nitride, deposited in between the bulk substrate and the silicon layer of the NFET, a second insulator layer, including either an stressed oxide or nitride, deposited in between the bulk substrate and the silicon layer of the PFET.

In a second aspect of the invention, a semiconductor device is provided. The semiconductor device includes a bulk substrate, a buried oxide (BOX) layer deposited on top of the bulk substrate, an extremely thin silicon on insulator (ETSOI) layer deposited on top of the BOX layer, a plurality of shallow trench isolations structures formed in the bulk substrate for isolating active areas for forming an NFET device and PFET for forming a gate channel region for respective NFET and PFET device, a NFET having a source region, a drain region, and a gate formation, a PFET having a source region, a drain region, and a gate formation, an insulator layer, including a stressed oxide or nitride, deposited in between the bulk substrate and the ETSOI layer of the NFET, and a second insulator layer, including either an stressed oxide or nitride, deposited in between the bulk substrate and the ETSOI layer of the PFET.

In a third aspect of the invention, a method for forming a semiconductor device is provided. The method includes providing a bulk substrate layer, forming shallow trench isolation regions in a substrate to isolate active regions for forming a first FET region and a second FET region, forming a hard mask over the second FET region, recessing the bulk substrate layer in the first FET region, depositing silicon germanium (SiGe) in the recess of the first FET region, depositing a layer of silicon on top of the SiGe, forming a gate electrode structure on the first FET region and a corresponding gate conductor formed atop of the gate dielectric layer on the first FET region, recessing the shallow trench isolation regions surrounding first FET region to the bottom of the SiGe layer, removing the SiGe layer, which creates an air gap, filling the air gap with an insulator layer comprising either stressed oxide or stressed nitride, filling the recessed shallow trench isolations regions with an oxide, removing the hard mask layer from the second FET region, forming a hard mask or soft mask over the first FET region, recessing the bulk substrate layer of the second FET region, depositing a SiGe layer in the recess of the second FET region and depositing a silicon layer on top of the SiGe layer, forming a gate electrode structure on the second FET region and a corresponding gate conductor formed atop of the gate dielectric layer on the second FET device, recessing the shallow trench isolation regions surrounding the second FET region to the bottom of the SiGe layer, removing the SiGe layer, which creates an air gap, filling the air gap with an insulator including either stressed oxide or stressed nitride, filling the recessed shallow trench isolation regions with an oxide, and removing the hard mask layer from the first FET region.

In a fourth aspect of the invention, another method for forming a semiconductor device is provided. The method includes providing a bulk substrate layer, a buried oxide (BOX) layer disposed on the substrate layer, a extremely thin silicon on insulator (ETSOI) layer disposed on the buried oxide (BOX) layer, forming shallow trench isolation regions in a substrate to isolate active ETSOI regions for forming a first FET region and a second FET region, forming a hard mask over the second FET region, recessing the bulk substrate layer in the first FET region, depositing silicon germanium (SiGe) in the recess of the first FET region, depositing a layer of silicon on top of the SiGe, forming a gate electrode structure on the first FET region and a corresponding gate conductor formed atop of the gate dielectric layer on the first FET region, recessing the shallow trench isolation regions surrounding first FET region to the bottom of the SiGe layer, removing the SiGe layer, which creates a first air gap, filling the air gap with an insulator layer comprising either stressed oxide or stressed nitride, filling the recessed shallow trench isolations regions with an oxide, removing the hard mask layer from the second FET region, forming a hard mask or soft mask over the first FET region, recessing the bulk substrate layer of the second FET region, depositing a SiGe layer in the recess of the second FET region and depositing a silicon layer on top of the SiGe layer, forming a gate electrode structure on the second FET region and a corresponding gate conductor formed atop of the gate dielectric layer on the second FET device, recessing the shallow trench isolation regions surrounding the second FET region to the bottom of the SiGe layer, removing the SiGe layer, which creates a second air gap, filling the second air gap with an insulator including either stressed oxide or stressed nitride, filling the recessed shallow trench isolation regions with an oxide, and removing the hard mask layer from the first FET region.

In a fifth aspect of the invention, another method for forming a semiconductor device is provided. The method includes providing a bulk substrate layer, forming shallow trench isolation regions to isolate active regions for forming a first FET region and a second FET region, forming a hard mask over said bulk substrate, recessing said bulk substrate layer on both FET regions, depositing silicon germanium (SiGe) layer in the recesses of both FET regions, depositing a silicon layer on top of the SiGe layer, forming a gate electrode structure on both FET regions and a corresponding gate conductor formed atop of the gate dielectric layer on both FET regions, recessing the shallow trench isolation regions surrounding both FET regions down to the bottom of the SiGe layer, forming a hard mask over the second FET region, removing the SiGe layer from the first FET region, which creates a first air gap, filling the air gap with an insulator including either stressed oxide or stressed nitride, filling the shallow trench isolation with an oxide, removing the hard mask layer from the second FET region, forming a hard mask over the first FET region, removing the SiGe layer from the second FET region, which creates a second air gap, filling the second air gap with an insulator including either stressed oxide or stressed nitride, and removing the hard mask layer from the first FET region.

In a sixth aspect of the invention, another method for forming a semiconductor device is provided. The method includes providing a bulk substrate layer, a buried oxide (BOX) layer disposed on the substrate layer, a extremely thin silicon on insulator (ETSOI) layer disposed on the buried oxide (BOX) layer, forming shallow trench isolation regions to isolate active regions for forming a first FET region and a second FET region, forming a hard mask over said bulk substrate, recessing said bulk substrate layer on both FET regions, depositing silicon germanium (SiGe) layer in the recesses of both FET regions, depositing a silicon layer on top of the SiGe layer, forming a gate electrode structure on both FET regions and a corresponding gate conductor formed atop of the gate dielectric layer on both FET regions, recessing the shallow trench isolation regions surrounding both FET regions down to the bottom of the SiGe layer, forming a hard mask over the second FET region, removing the SiGe layer from the first FET region, which creates a first air gap, filling the air gap with an insulator including either stressed oxide or stressed nitride, filling the shallow trench isolation with an oxide, removing the hard mask layer from the second FET region, forming a hard mask over the first FET region, removing the SiGe layer from the second FET region, which creates a second air gap, filling the second air gap with an insulator including either stressed oxide or stressed nitride, and removing the hard mask layer from the first FET region.

DETAILED DESCRIPTION OF THE PREFERRED EMBODIMENTS

Figure 1A:
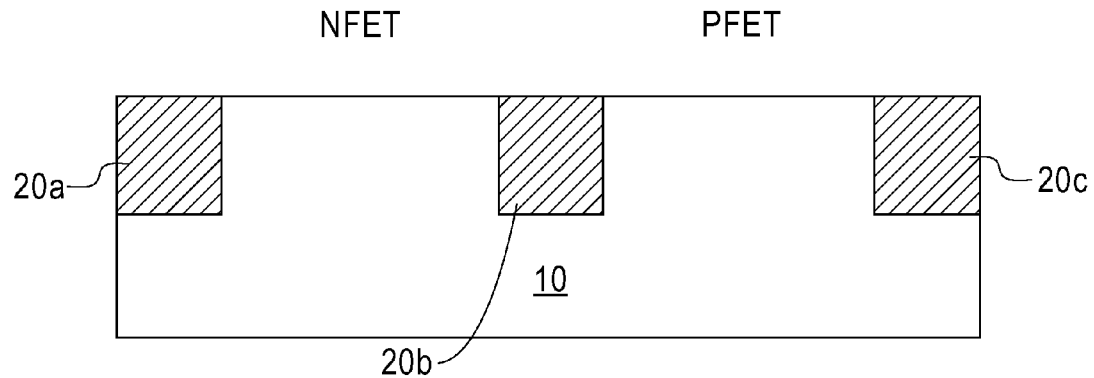
FIG. 1A shows a bulk substrate with shallow trench isolations.

The embodiments of the invention and the various features and advantageous details thereof are explained more fully with reference to the non-limiting embodiments that are illustrated in the accompanying drawings and detailed in the following description. It should be noted that the features illustrate in the drawings are not necessarily drawn to scale. Descriptions of well-known components and processing techniques are omitted so as to not unnecessarily obscure the embodiments of the invention.

The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. It will also be understood that when a layer is referred to as being "on" another layer or substrate, it can be directly on the other layer or substrate, or intervening layers may also be present.

Reference is first made to FIG. 1A-1K, which illustrate an embodiment of the present invention, where a formation on bulk substrate with high-k gate dielectrics and dual gate metals. FIG. 1A shows an initial structure, which includes a bulk substrate (10) and shallow trench isolations (20a, 20b and 20c). Specifically, the shallow trench isolation pattern is formed by applying a photoresist on the upper surface of the pad stack. The photoresist is then exposed to a pattern of radiation and thereafter the pattern in the photoresist is developed using a resist developer. An etching step is used to transfer the pattern from the photoresist into the substrate layer. After the initial pattern transfer, the photoresist is removed utilizing a stripping process.

Figure 1B:
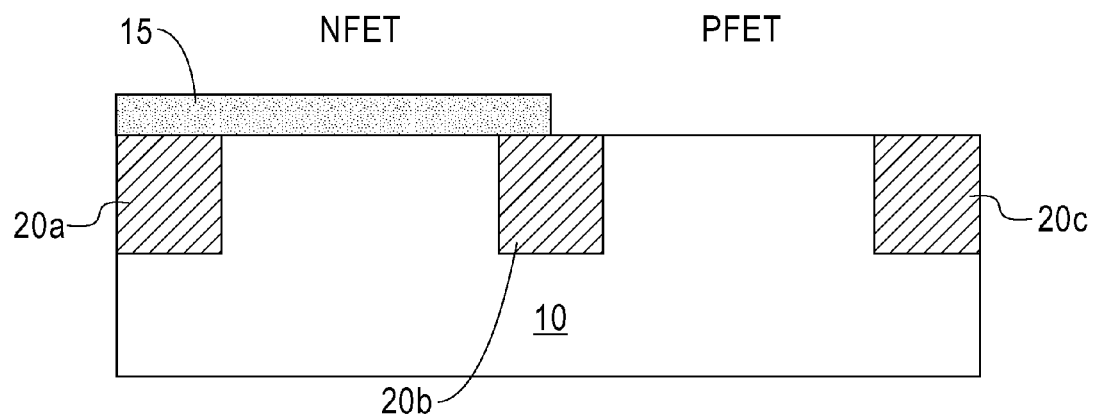
FIG. 1B shows a masking layer on the NFET region.
Figure 1C:
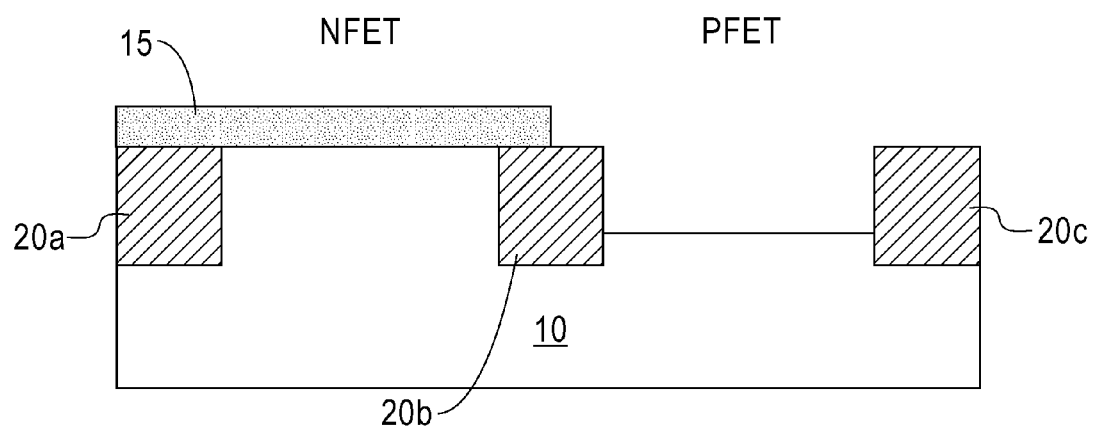
FIG. 1C shows etching on the PFET region.

In FIG. 1B, a blanket layer of hard mask (15) made of silicon nitride is applied to the NFET region. This hard mask layer (15) is patterned by lithography and etching, in order to protect the NFET region from the etching step to follow. In FIG. 1C, the silicon on the PFET region is recessed by etching method to a depth ranging from 15 nm to 80 nm. The key process is the first selective epitaxy of silicon germanium (SiGe) layer (25) on the PFET active areas. This growth should be enhanced by epitaxial process control to have no facet formation at the edge of the shallow trench isolation.

Figure 1D:
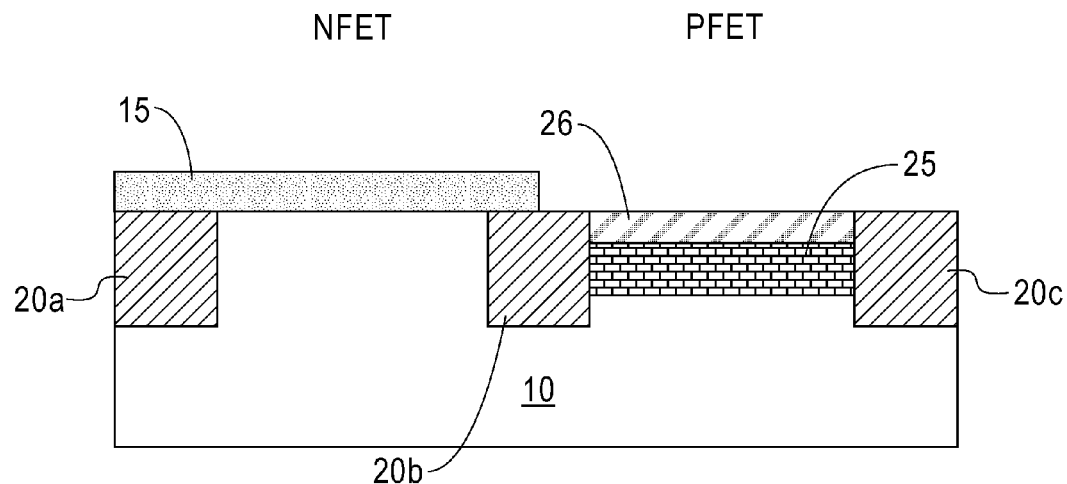
FIG. 1D shows epitaxial deposit of the SiGe and Si on the PFET region.

The SiGe layer (25) is buried by the following silicon layer (26) by epitaxial growth as shown in FIG. 1D.

Figure 1E:
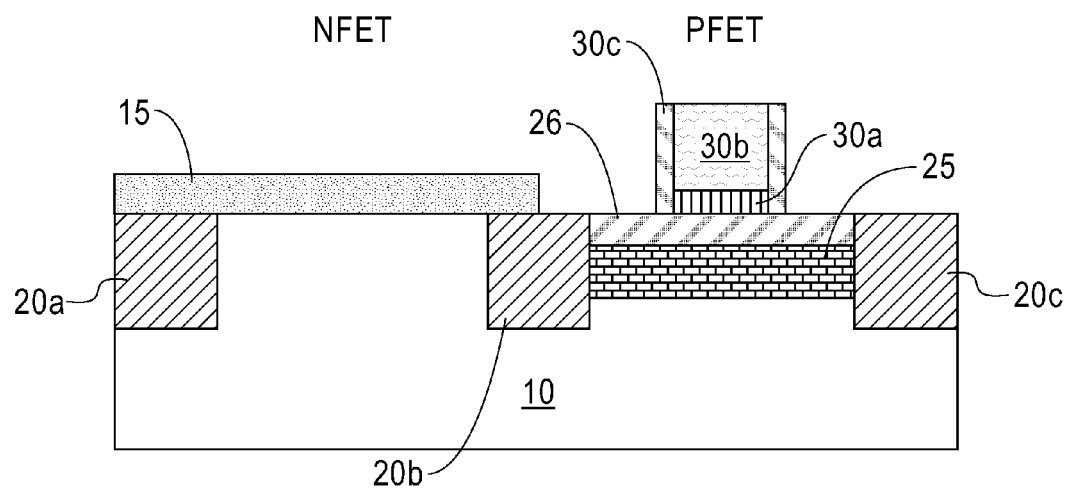
FIG. 1E shows the gate formation on the PFET region.
Figure 1F:
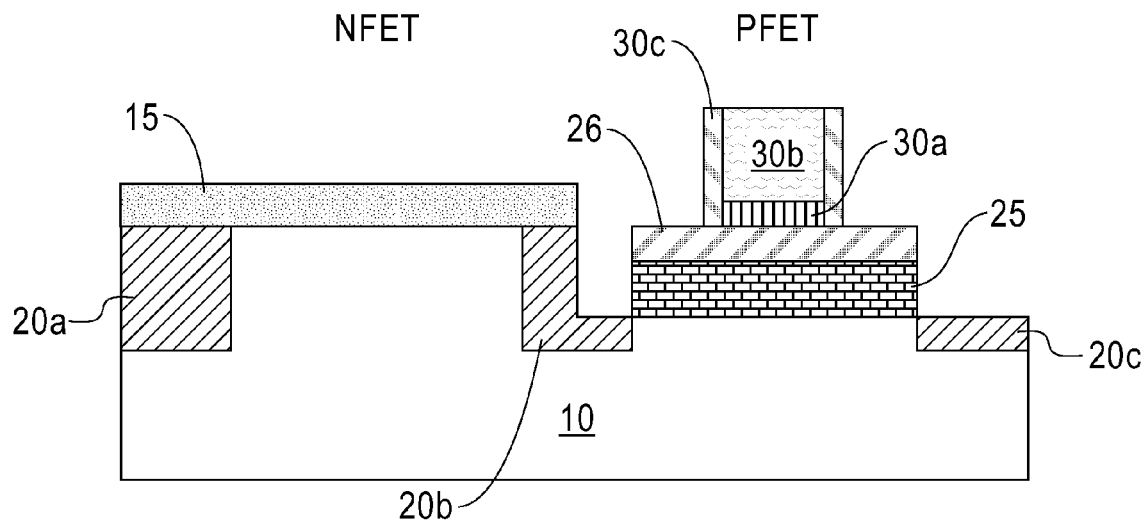
FIG. 1F shows etching the shallow trench isolations.

In FIG. 1E, a gate dielectric layer (30a) is then formed on top of the PFET region. The gate dielectric layers (30a) may include conventional dielectric materials such as oxides, nitrides and oxynitrides of silicon that have a dielectric constant from about 4 (i.e., typically a silicon oxide) to about 8 (i.e., typically a silicon nitride), measured in vacuum. Alternatively, the gate dielectric may include generally higher dielectric constant dielectric materials having a dielectric constant from about 8 to at least about 100. Such higher dielectric constant dielectric materials may include, but are not limited to hafnium oxides, hafnium silicates, zirconium oxides, lanthanum oxides, titanium oxides, barium-strontium-titantates (BSTs) and lead-zirconate-titanates (PZTs).

The gate dielectrics (30a) for each of the respective NFET and PFET devices may be formed using any of several methods that are appropriate to its material of composition. Non-limiting examples include thermal or plasma oxidation or nitridation methods, chemical vapor deposition methods (including atomic layer deposition methods) and physical vapor deposition methods. Typically, the gate dielectric layers (30b) for each of the NFET and PFET devices include a thermal silicon oxide dielectric material that has a thickness from about 10 to about 30 angstroms.

The gate electrodes (30b) are then formed for the PFET device. The gate electrodes (30b) may include, but not limited to, certain metals, metal alloys, metal nitrides and metal silicides, as well as laminates thereof and composites thereof. The gate electrodes (30b) may also include doped polysilicon and polysilicon-germanium alloy materials (i.e., having a dopant concentration from about $1\times10^{19}$ to about $1\times10^{22}$ dopant atoms per cubic centimeter) and polycide materials (doped polysilicon/metal silicide stack materials). Similarly, the foregoing materials may also be formed using any of several methods. Non-limiting examples include silicide methods, chemical vapor deposition methods and physical vapor deposition methods, such as, but not limited to evaporative methods and sputtering methods.

Typically, the gate electrodes (30b) each include a doped polysilicon material that has a thickness from about 500 to about 1500 angstroms. The NFET gate polysilicon is then doped with n-type dopants (As or P or Sb) and the PFET gate polysilicon with p-type dopants (B or BF, or In). Selective doping is achieved using photolithography to cover one type of FETs while exposing the other to ion implants. Since this is a high-k dielectric dual metal gate transistor, the PFET gate dielectric and PFET gate metal differs from the NFET gate dielectric and NFET gate metal.

Figure 1G:
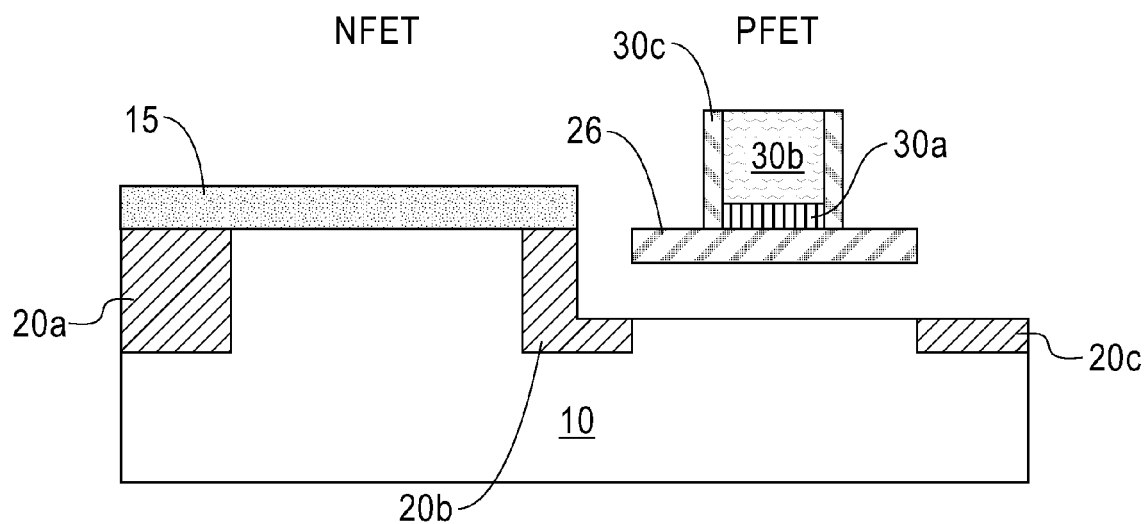
FIG. 1G shows the removal of the SiGe layer on the PFET region.
Figure 1H:
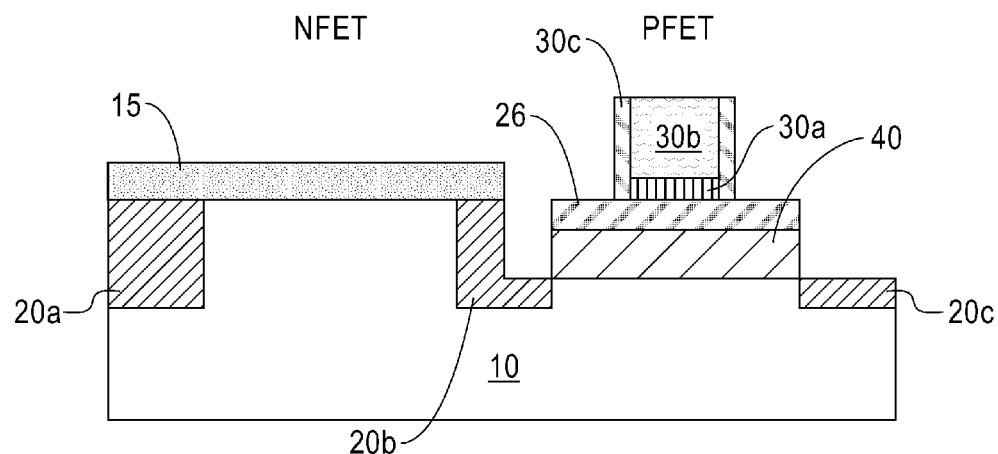
FIG. 1H shows the deposit of the insulating layer on the PFET region.

After the gate stack (30a, 30b) and offset spacer (30c) formation, the shallow trench isolations around the PFET (20b, 20c) will have a short recess to allow the removal of the silicon germanium SiGe layer (25). The recess depth is in the range of 15 nm to 80 nm. The SiGe layer (25) is then removed from by selective wet etching. The wet etch can be used by commonly known methods such as hydrochloric acid. As shown in FIG. 1G, the wet etching leaves an air gap in between the bulk substrate and the Si layer. The sustained active areas are fabricated and the stability of these areas is ensured by the gates overlapping shallow trench isolation regions. The control of this etching process is very critical. After removing the SiGe layer (25), the air gap can be filled by an insulator layer (40) as shown in FIG. 1H. The insulator layer (40) can either be stressed nitride or stressed oxide. The layer can be either a compressive stressed layer or tensile stressed layer, depending on which FET device. In this case, the layer will be a compressive stressed layer since it is on the PFET device.

Figure 1I:
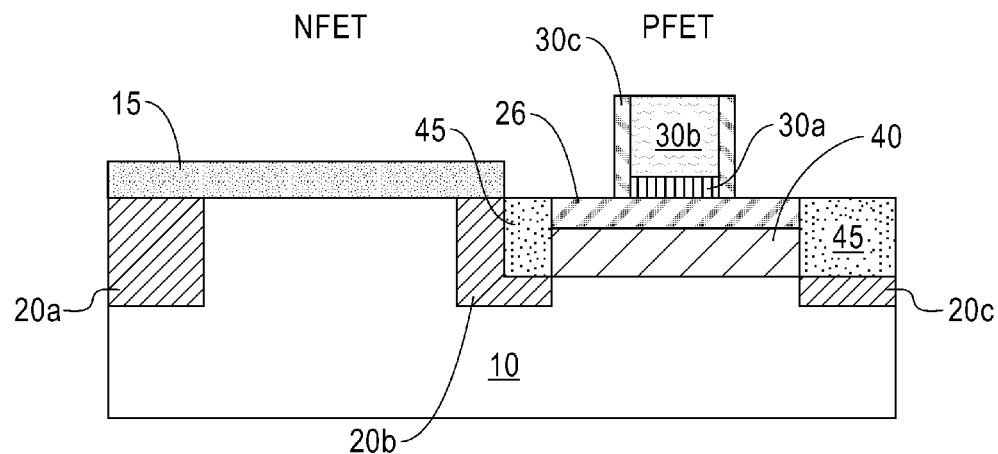
FIG. 1I shows the shallow trench isolation fill.
Figure 1J:
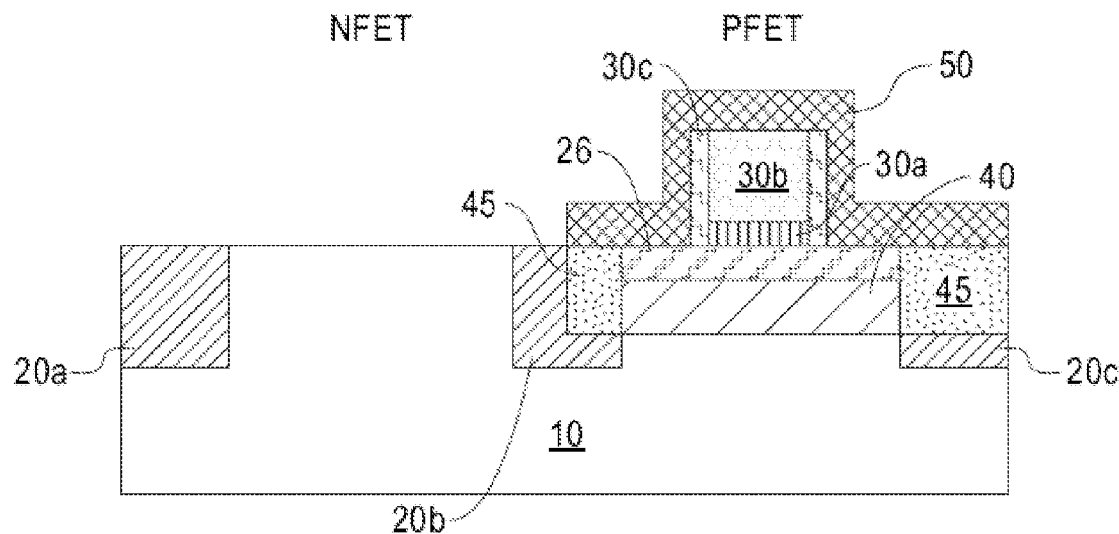
FIG. 1J shows the masking of the PFET region to repeat the process on the NFET region.

In FIG. 1I, the shallow trench isolations (20b, 20c) are then filled with an oxide (45) so that it is flush with the top of the Si layer (26). The shallow trench isolations (20b, 20c) can be filled with a tensile stressed oxide to further enhance the strain of the device. As shown in 1J, the mask (15) is removed from the NFET region. Another mask (50) is put on to protect the PFET region. The mask (50) can be either a hard mask or a soft mask depending on the needs.

Figure 1K:
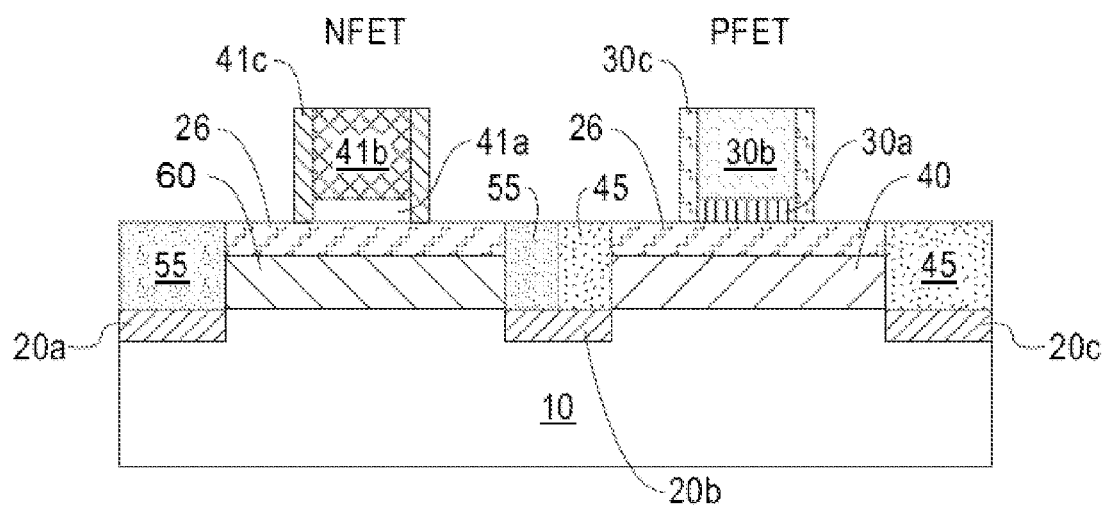
FIG. 1K shows the final product.

A similar process will be performed on NFET region. The selective epitaxy of SiGe/Si in NFET active area after the short STI recess. On the NFET region, the silicon is recessed to a depth ranging from 15 nm to 80 nm. An epitaxial growth of SiGe layer (25) and Si layer (26) is then deposited so that it is flush with the top of the shallow trench isolations (20 a, 20 b). The gate stack (41 a, 41 b, 41 c) is then formed and the shallow trench isolation is recessed to a depth ranging from 15 nm to 80 nm. Note that the gate stack on the NFET is a different metal and different high-k dielectric than the PFET. The SiGe layer (25) is then removed and replaced with an insulating layer (60) of a tensile stressed oxide or nitride. The shallow trench isolations (20 a, 20 b) are then filled with an oxide or a compressive stressed oxide (55) to further enhance the strain in the NFET region. The hard mask is then removed, revealing the high-k gate dielectrics, dual gate metals, dual stress buried insulator structure as shown in FIG. 1K.

Figure 2A:
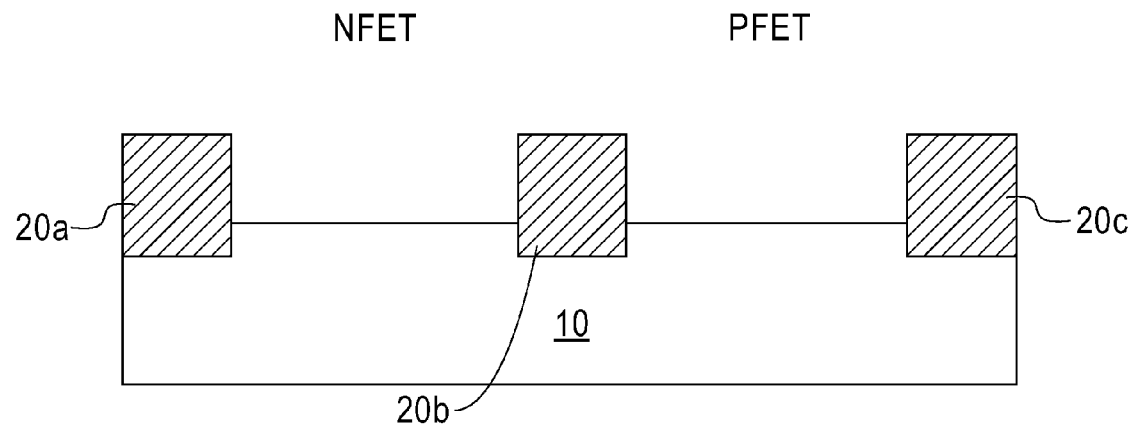
FIG. 2A shows etching on the NFET and PFET regions.
Figure 2B:
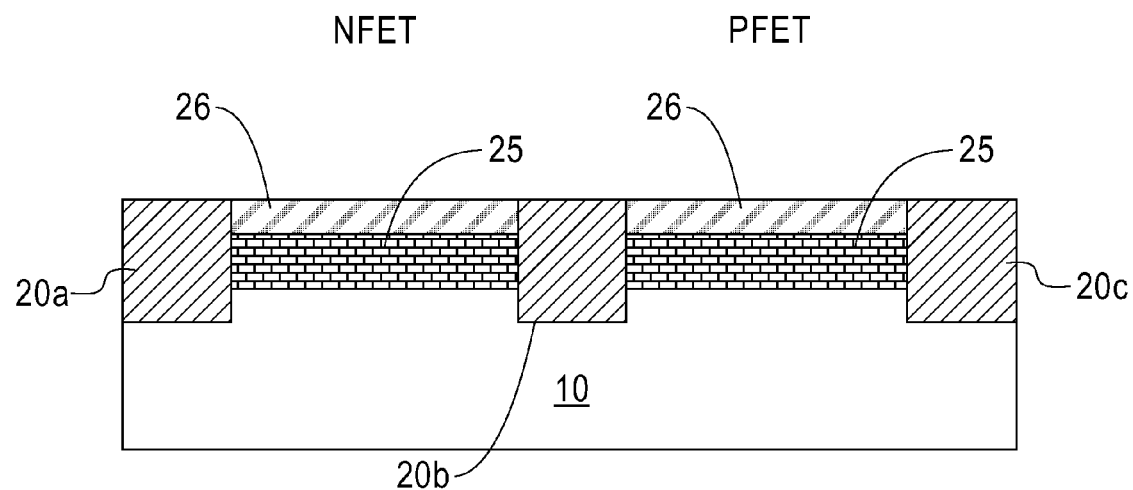
FIG. 2B shows epitaxial deposit of the SiGe and Si on the NFET and PFET regions.
Figure 2C:
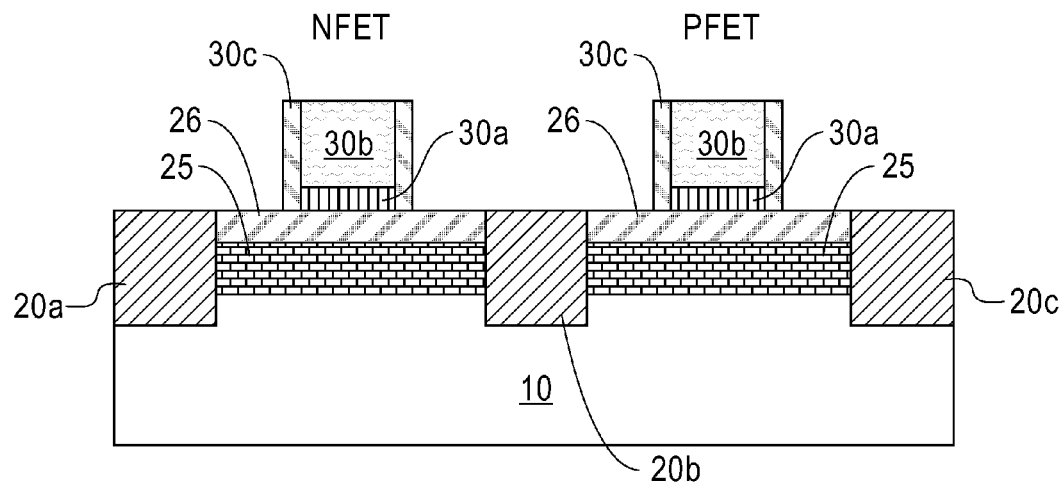
FIG. 2C shows the gate formation on the NFET and PFET regions.
Figure 2D:
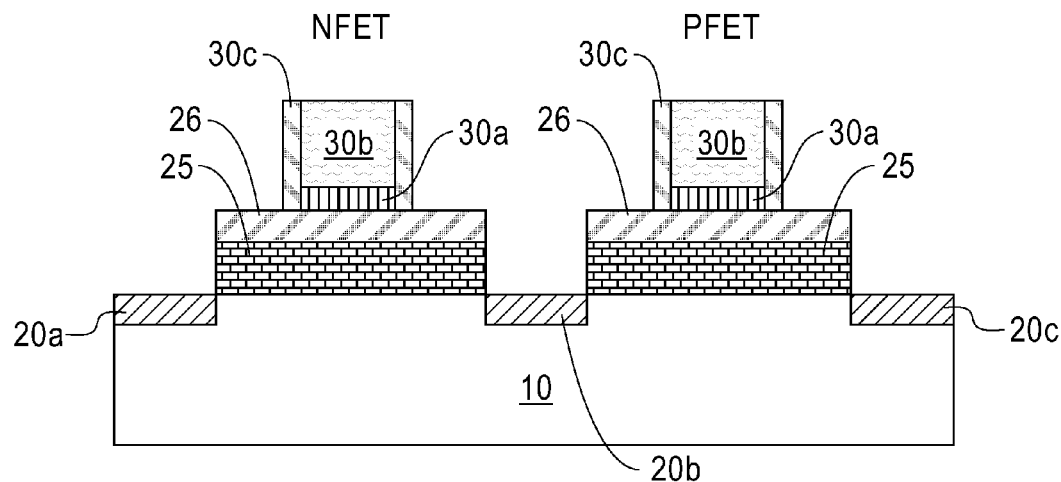
FIG. 2D shows etching the shallow trench isolations.

In FIG. 2A-2I, another method of forming the structure on a bulk substrate with a single gate metal. The bulk substrate (10) starts off with shallow trench isolations (20a, 20b, 20c) as previously shown in FIG. 1A. In FIG. 2A, the bulk substrate (10) silicon is recessed to a depth range of 15 nm to 80 nm in both the NFET and PFET region. According to FIG. 2B, the SiGe layer (25) and Si layer (26) are epitaxial grown on the substrate surface so that it is flush with the top of the shallow trench isolations (20b, 20c) on both the NFET and PFET regions. FIG. 2C shows the gate formations (30a, 30b, 30c) on the NFET and PFET regions. In FIG. 2D, after gate and spacer formation, the shallow trench isolations (20a, 20b, 20c) are recessed to a depth ranging from 15 nm to 80 nm.

Figure 2E:
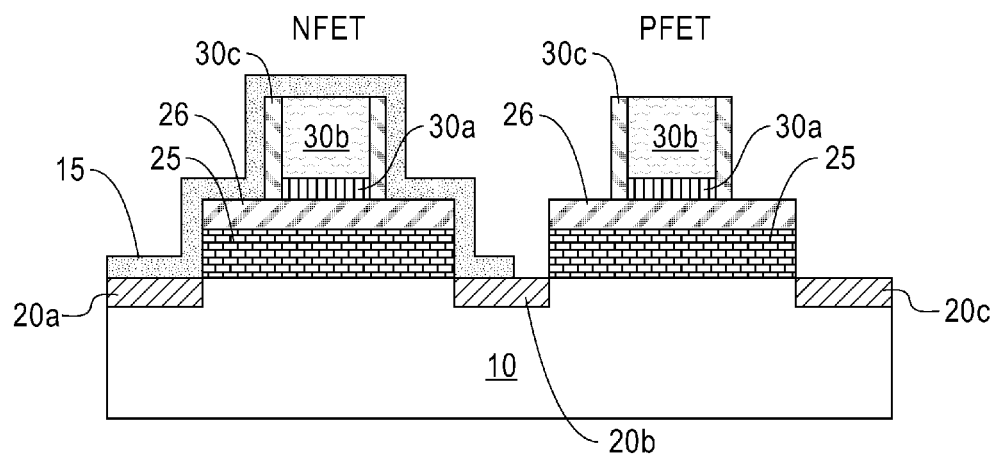
FIG. 2E shows a masking layer on the NFET region.
Figure 2F:
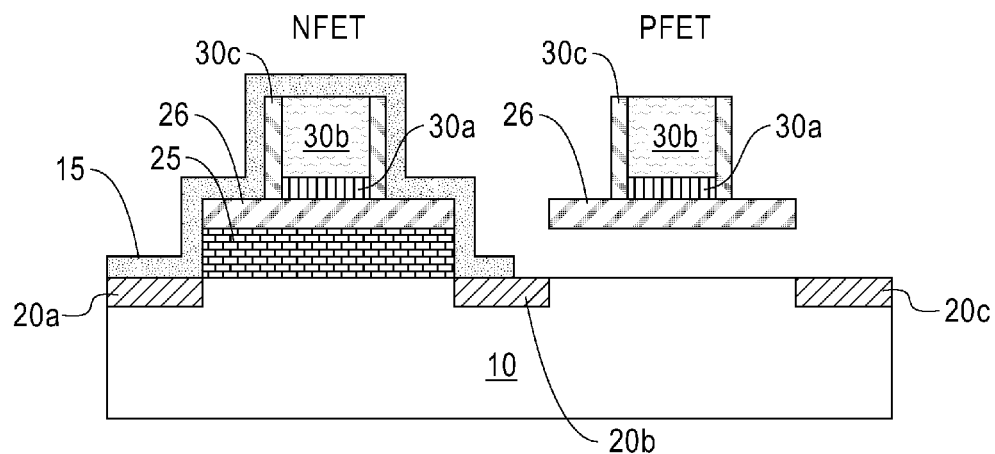
FIG. 2F shows the removal of the SiGe layer.
Figure 2G:
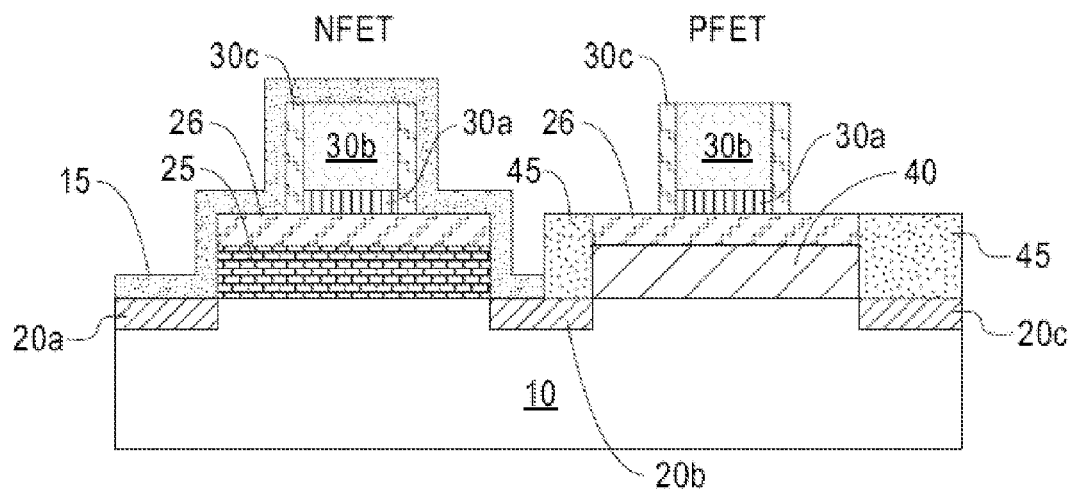
FIG. 2G shows the deposit of the insulating layer on the PFET region and the shallow trench isolation.
Figure 2H:
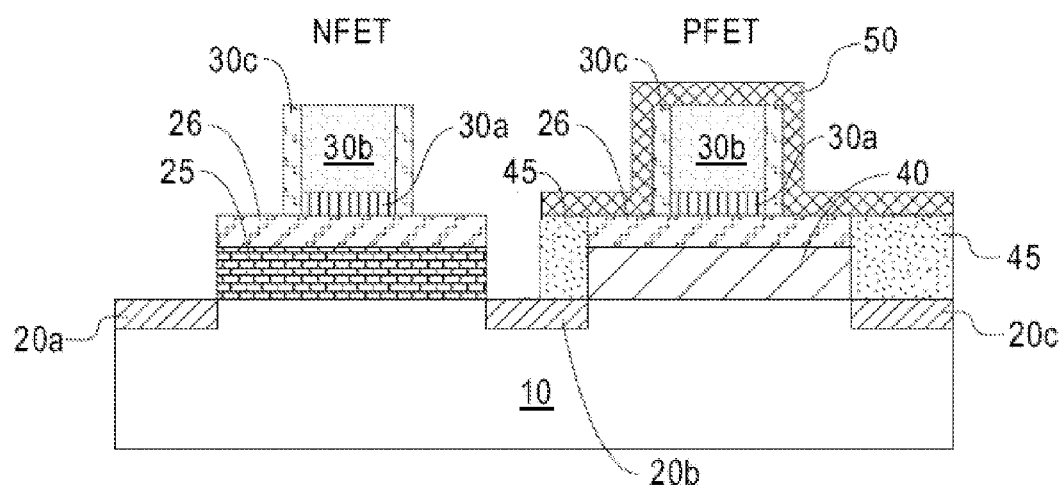
FIG. 2H shows the masking of the PFET region to repeat the process on the NFET region.

In FIG. 2E, a hard mask (15) is applied to the NFET region. The SiGe layer (25) in the PFET region is then removed by wet etching as shown in FIG. 2F. In FIG. 2G, the air gap is then filled with insulator layer (40), which can be a compressive stressed nitride or compressive stressed oxide. The shallow trench isolation will also be filled with either an oxide or tensile stressed oxide (45). The tensile stressed oxide used in the shallow trench may further enhance the channel stress. The oxide fill will be flush with the top layer of the Si on the PFET region. In FIG. 2H, after removing the hard mask on the NFET region, another mask (50) is then applied to the PFET region. The mask (50) can either be a soft mask or a hard mask. The process then repeats for to implant the insulator in the NFET region.

Figure 2I:
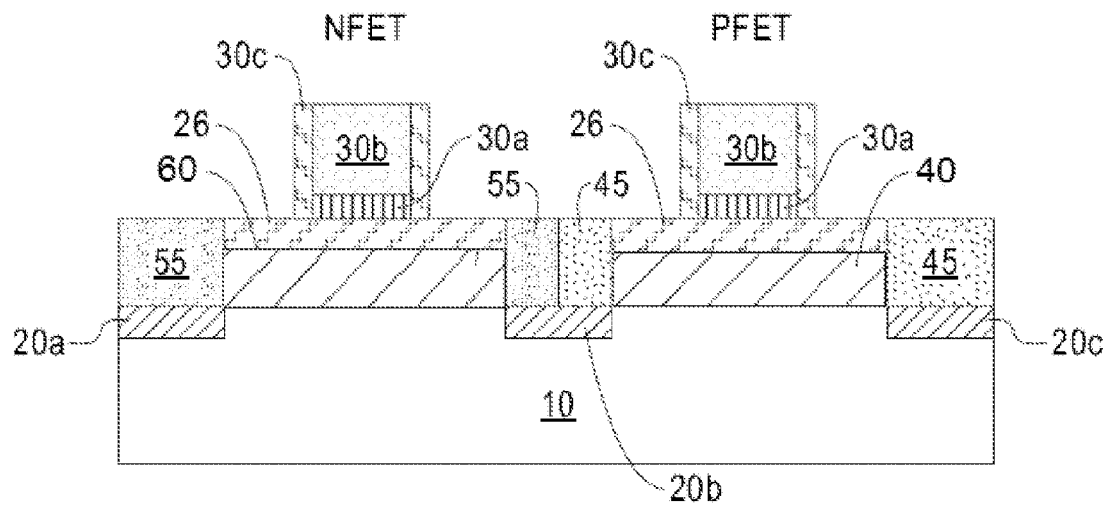
FIG. 2I shows a single gate metal dual buried insulating layer transistor.

The SiGe layer (25) of the NFET region is removed. A tensile stressed insulator (60) then fills the air gap where the SiGe layer (25) was removed. The shallow trench isolation will also be filled with either an oxide or compressive stressed oxide (55). The fill will be flush with the top layer of the Si on the PFET region. The mask on the PFET region is then removed, revealing the dual stress buried insulator structure as shown in FIG. 2I.

Figure 3A:
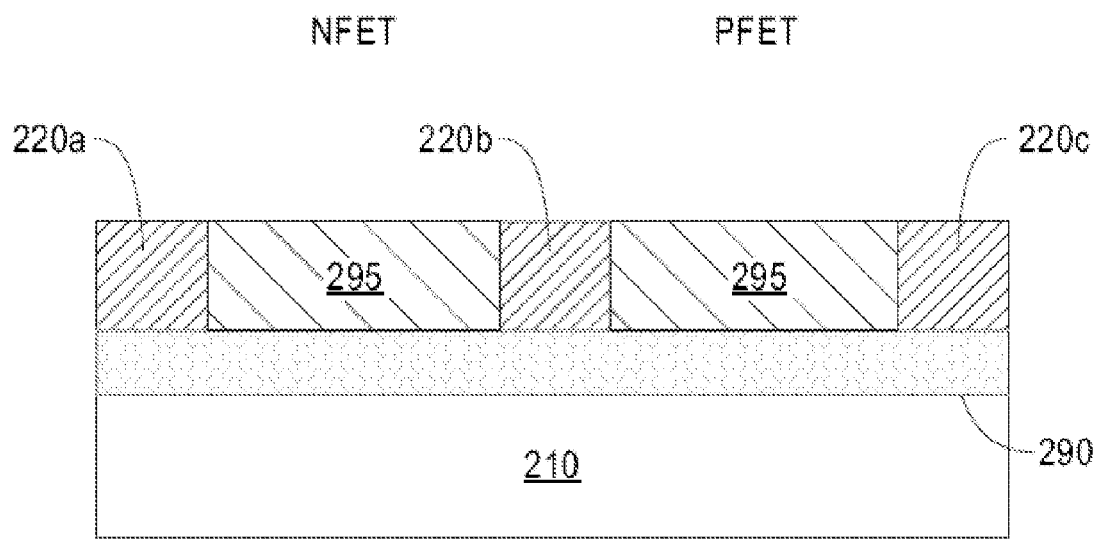
FIG. 3A shows an SOI substrate.

In FIG. 3A-3L, a silicon-on-insulator (SOI) substrate, with a high-k dielectric and dual metal gate is shown. FIG. 3A shows a SOI substrate which includes the bulk substrate (210), BOX layer (290) and a SOI layer (295). The SOI substrate is fabricated using techniques that are well known to those skilled in the art. For example, the SOI substrate can be fabricated using a thermal bonding process, or alternatively the SOI substrate may be fabricated by an ion implantation process that is referred to in the art as separation by ion implantation of oxygen (SIMOX). When a thermal bonding process is employed in fabricating the SOI substrate, an optional thinning step may be utilized to thin the top Si-containing layer into an ultra-thin regime. After the layers have been compiled, the shallow trench isolations (220a, 220b, 220c) are then formed to separate the active areas.

Figure 3B:
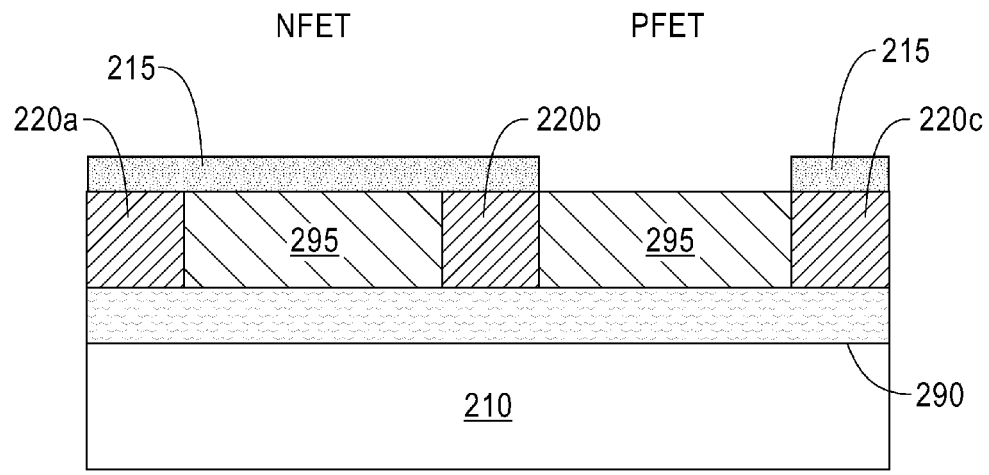
FIG. 3B shows a masking layer on the NFET region and shallow trench isolations.
Figure 3C:
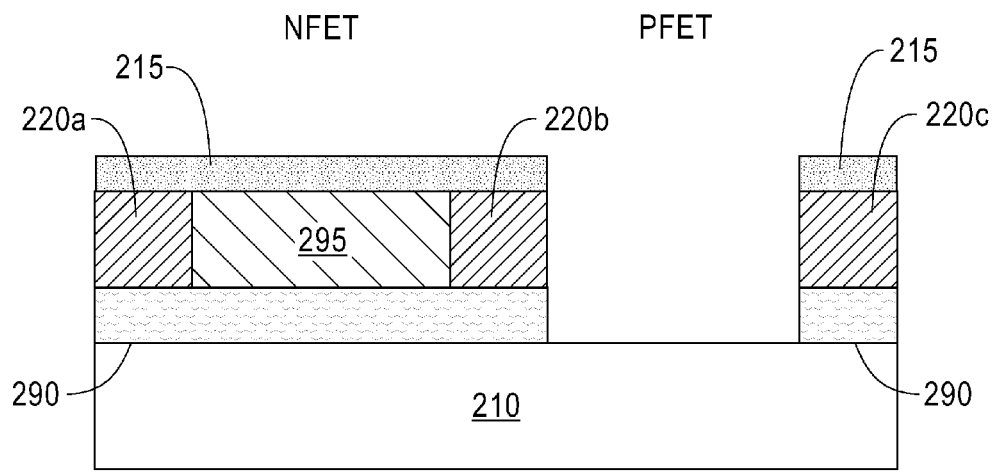
FIG. 3C shows etching on the PFET region.
Figure 3D:
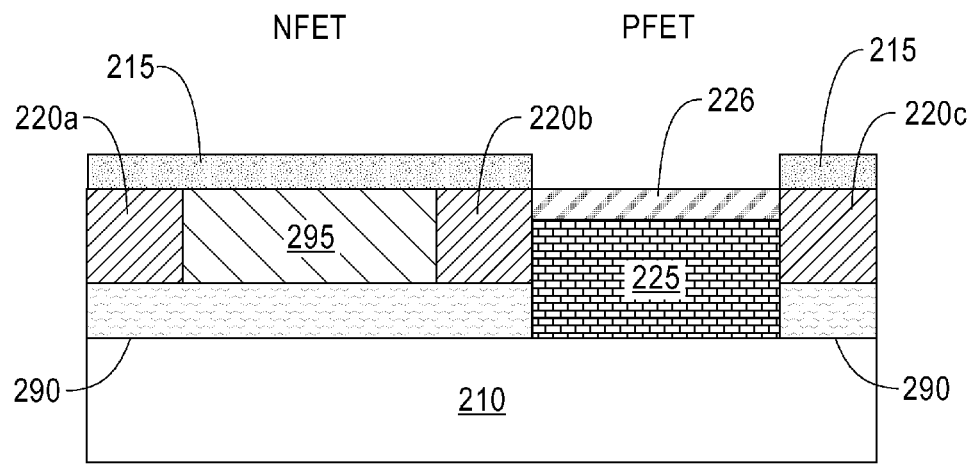
FIG. 3D shows epitaxial deposit of the SiGe and Si on the PFET region.
Figure 3E:
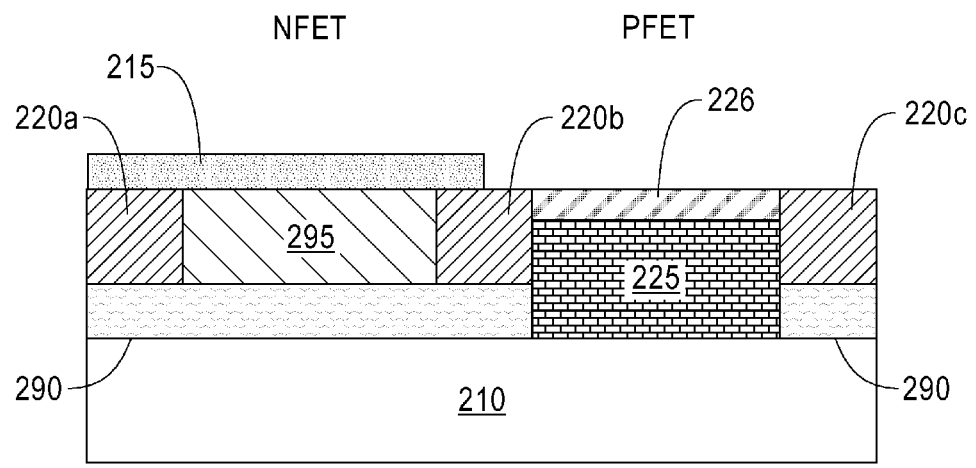
FIG. 3E shows removal of the mask on shallow trench isolation regions.

In FIG. 3B, a hard mask (215) is applied to the top of the SOI substrate. The hard mask (215) is then etched away at the PFET region, leaving the mask on top of the NFET region and the shallow trench isolations (220a, 220b, 220c). In FIG. 3C, the SOI layer (295) and BOX layer (290) are etched away to the top of the substrate layer (210) in the PFET region. In FIG. 3D, a SiGe layer (225) is implanted using epitaxy and a extremely thin silicon on insulator (ETSOI) (226) is also epitaxially grown on top of the SiGe layer (225). In FIG. 3E, a hard mask retrieval is then used to expose the shallow trench isolation portions on the PFET region.

Figure 3F:
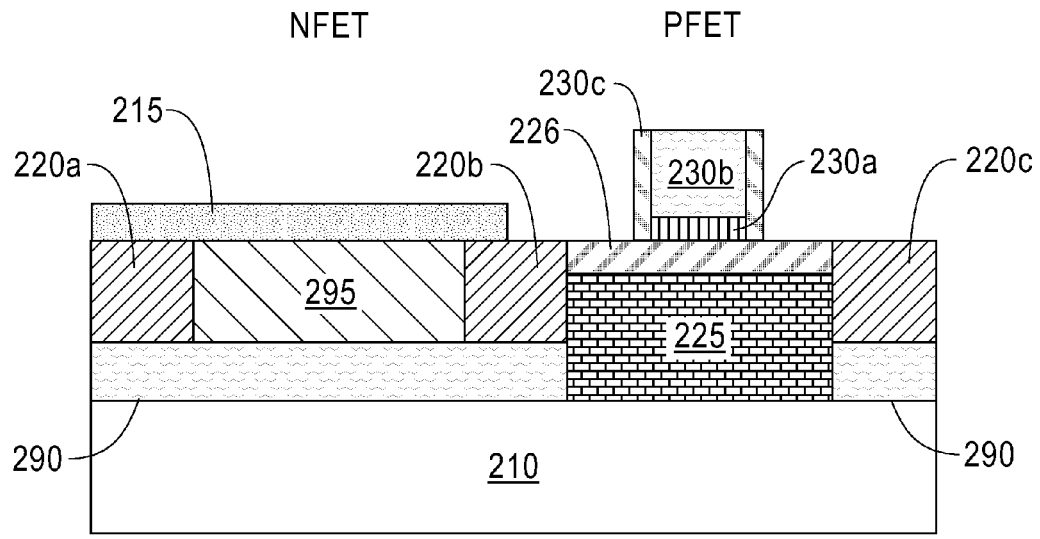
FIG. 3F shows the gate formation on the PFET region.
Figure 3G:
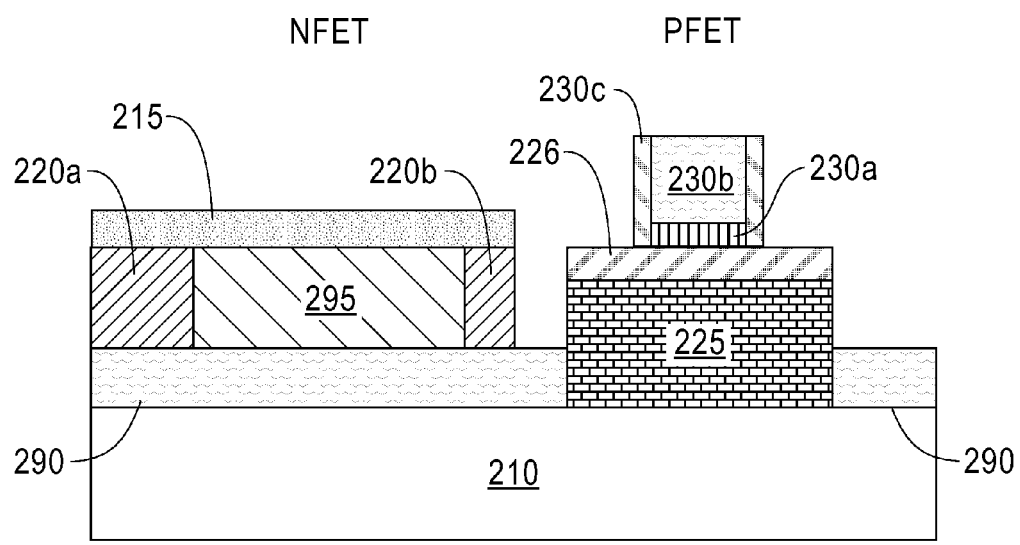
FIG. 3G shows etching the shallow trench isolations.
Figure 3H:
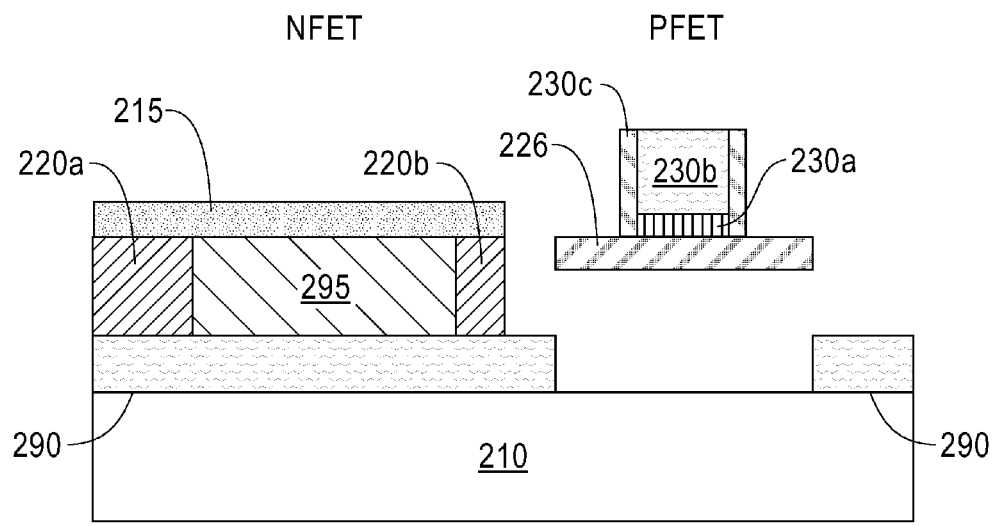
FIG. 3H shows the removal of the SiGe layer.
Figure 3I:
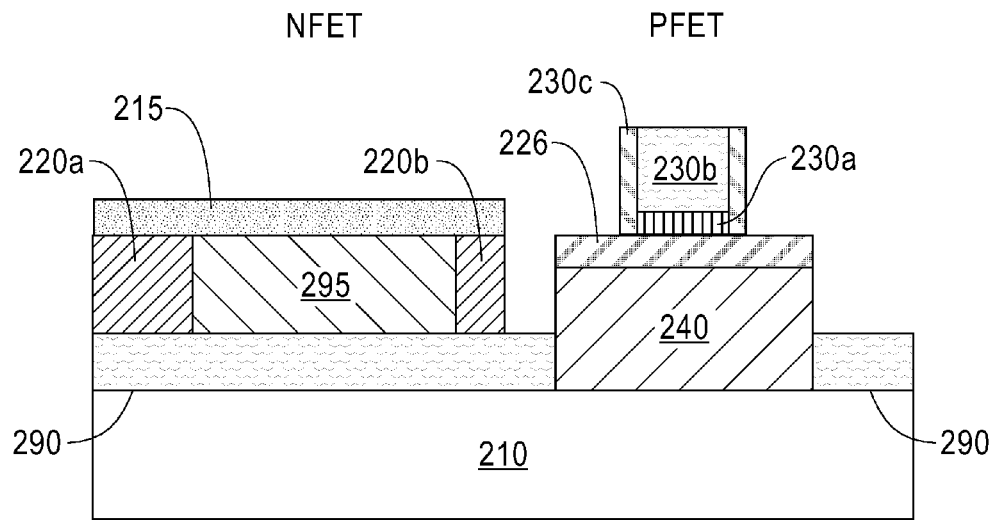
FIG. 3I shows the deposit of the insulating layer on the PFET region and the shallow trench isolation.
Figure 3J:
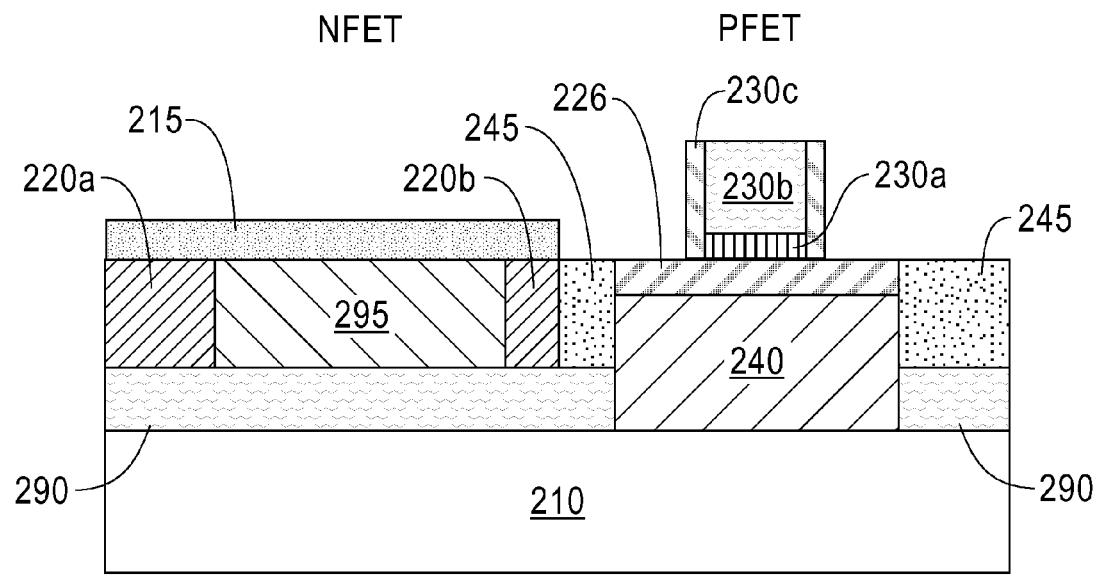
FIG. 3J shows the shallow trench isolation fill.
Figure 3K:
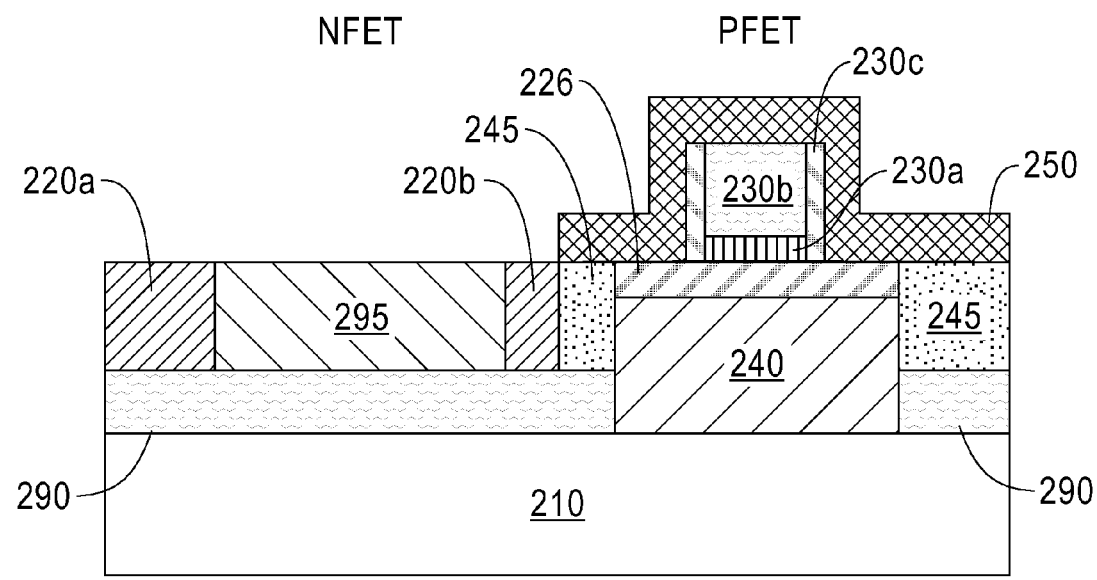
FIG. 3K shows the masking of the PFET region to repeat the process on the NFET region.

According to FIG. 3F, the gate (230a, 230b, 230c) are then formed on top of the PFET region. In FIG. 3G, the shallow trench isolations (220b, 220c) are then recessed to a depth ranging from 15 nm to 80 nm. In FIG. 3H, the SiGe layer (225) is then removed using a wet etch. FIG. 3I shows the air gap being filled by an insulating layer (240) of a stressed nitride or stressed oxide. In FIG. 3J, the shallow trench isolations (220b, 220c) are then filled with an oxide or stress oxide (245) so that it is flush with the top surface of the ETSOI layer (226). The hard mask (215) is then removed from the NFET region and a mask (250) is deposited on the PFET region.

Figure 3L:
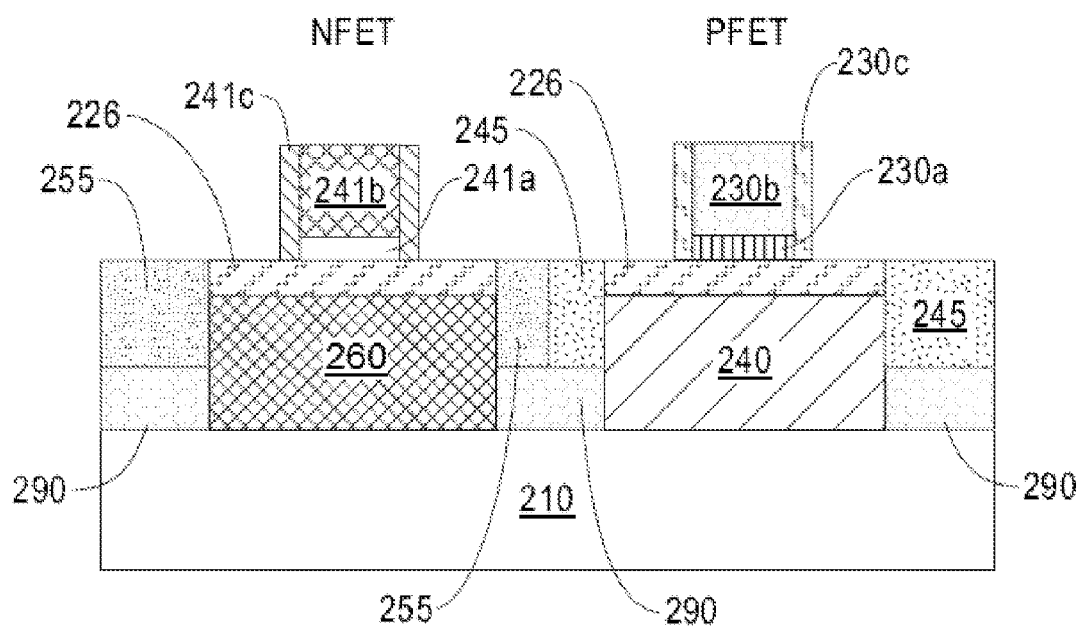
FIG. 3L shows the SOI high-k dielectric dual metal gate structure.

Similar process will be performed on NFET region. The selective epitaxy of SiGe/Si in NFET active area after the short STI recess. On the NFET region, the silicon is recessed to a depth ranging from 15 nm to 80 nm. An epitaxial growth of SiGe layer (225) and Si layer (226) is then deposited so that it is flush with the top of the shallow trench isolations (220 a, 220 b). The gate stack (241 a, 241 b, 241 c) is then formed and the shallow trench isolation is recessed to a depth ranging from 15 nm to 80 nm. Note that the gate stack on the NFET is a different metal and different high-k dielectric than the PFET. The SiGe layer (225) is then removed and replaced with an insulating layer (260) of a tensile stressed oxide or nitride. The shallow trench isolations (220 a, 220 b) are then filled with an oxide or a compressive stressed oxide to further enhance the strain in the NFET region. The hard mask is then removed, revealing the high-k gate dielectrics, dual gate metals, dual stress buried insulator structure as shown in FIG. 3L.

Figure 4A:
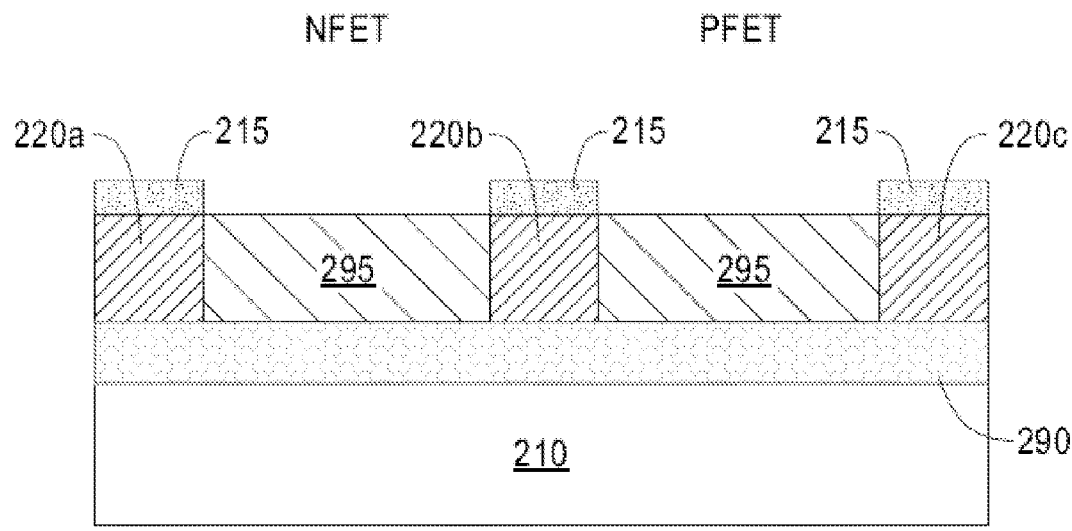
FIG. 4A shows a masking layer on the shallow trench isolations.
Figure 4B:
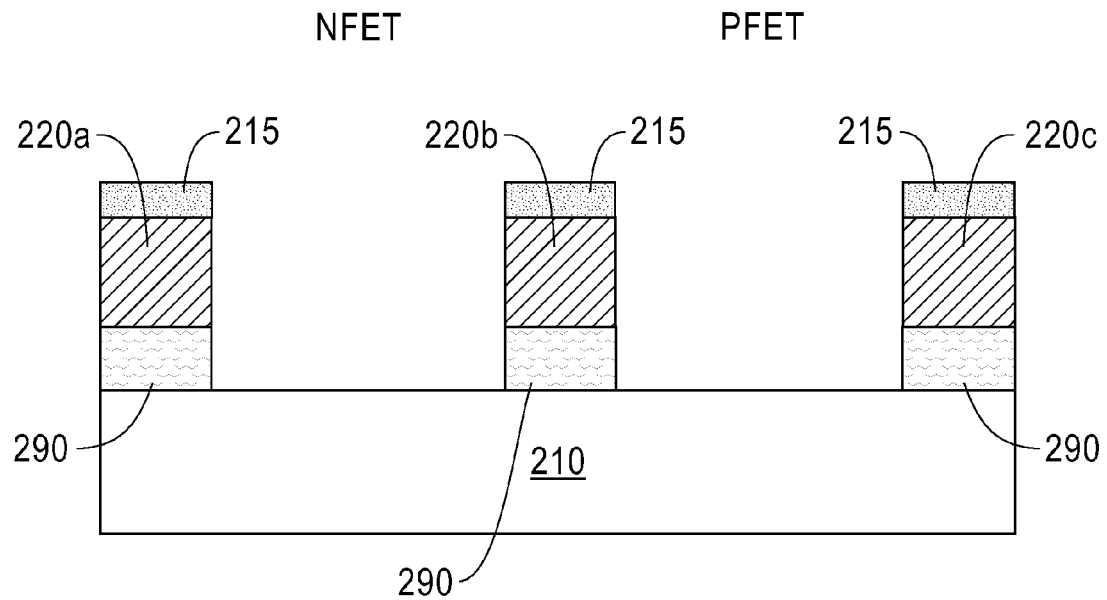
FIG. 4B shows etching on the NFET and PFET regions.
Figure 4C:
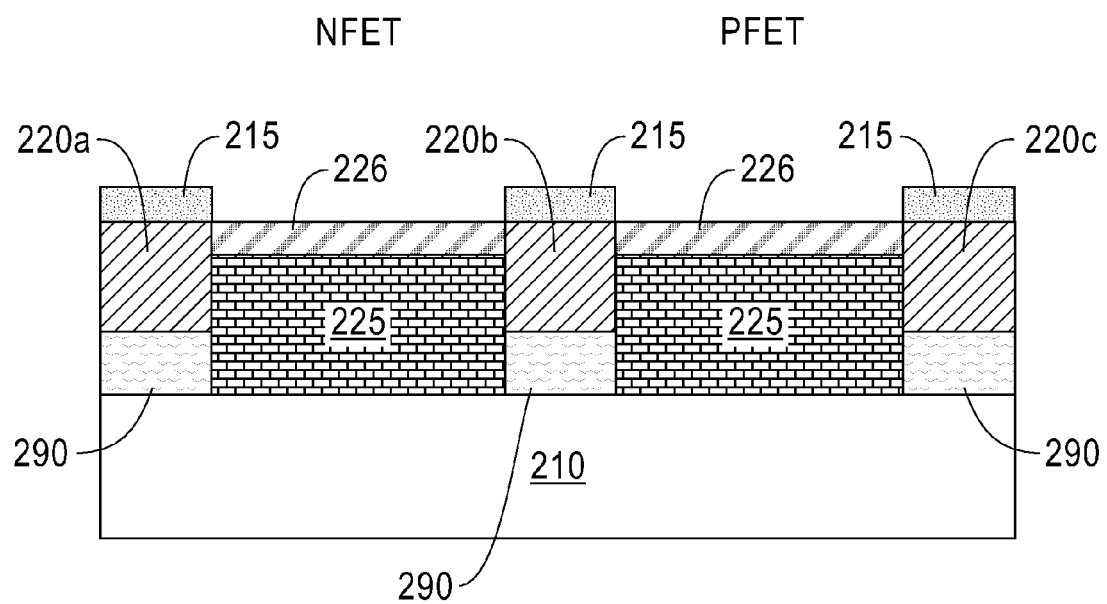
FIG. 4C shows epitaxial deposit of the SiGe and Si on the NFET and PFET regions.
Figure 4D:
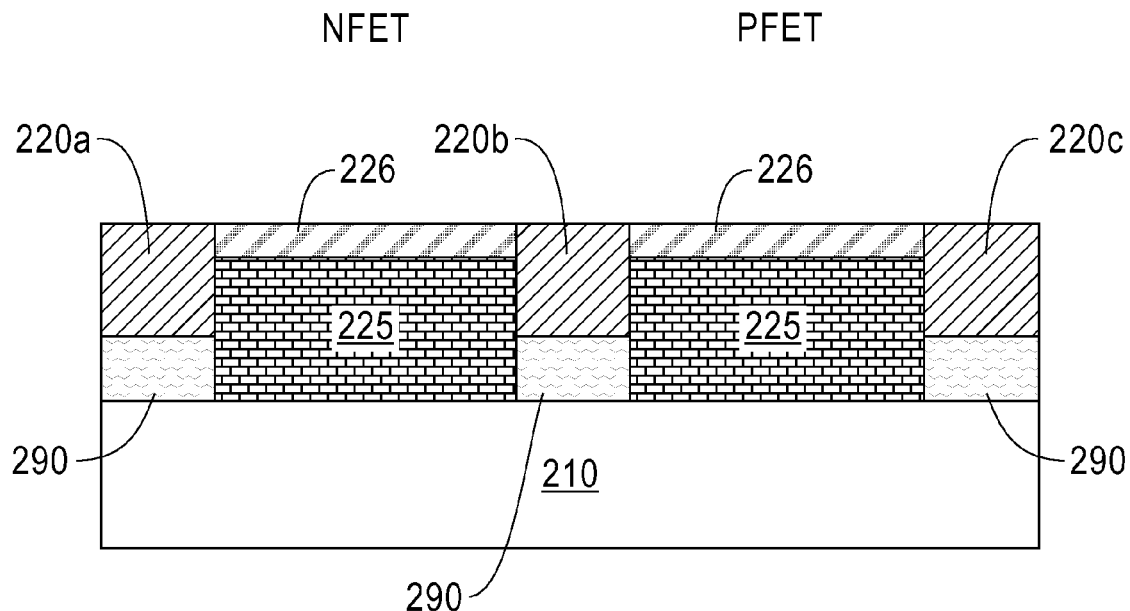
FIG. 4D shows removal of the mask on shallow trench isolation regions.

In FIG. 4A-4K, dual stressed buried insulator is disclosed by using a SOI substrate with a single gate metal. A SOI substrate is given as shown previously in FIG. 3A. However, the hard mask (215) is applied to the top surface and is etched at the NFET and PFET regions, leaving the mask on top of the shallow trench isolations (220a, 220b, 220c) of the device. In FIG. 4B, the SOI layer (295) and the BOX layer (290) are etched down to a depth of 15 nm to 80 nm. In FIG. 4c, the epitaxial growth of SiGe layer (225) and ETSOI layer (226) fills in the etched away portion in the NFET and PFET regions. The fill is flush with the top of the shallow trench isolations (220a, 220b, 220c). In FIG. 4D, the hard masks (215) are removed by etching.

Figure 4E:
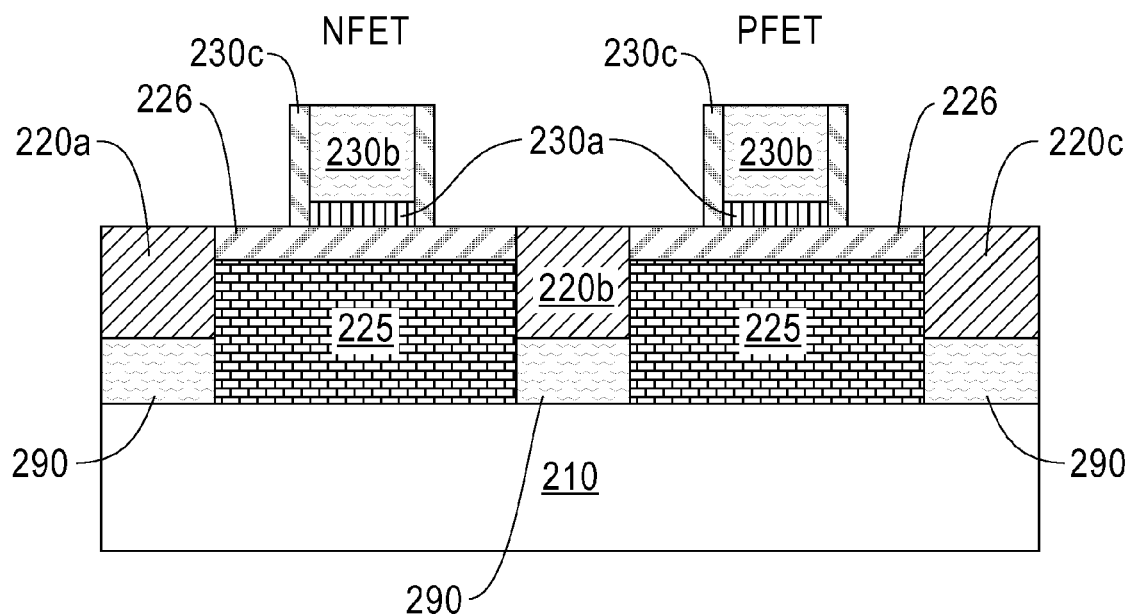
FIG. 4E shows the gate formation on the NFET and PFET regions.
Figure 4F:
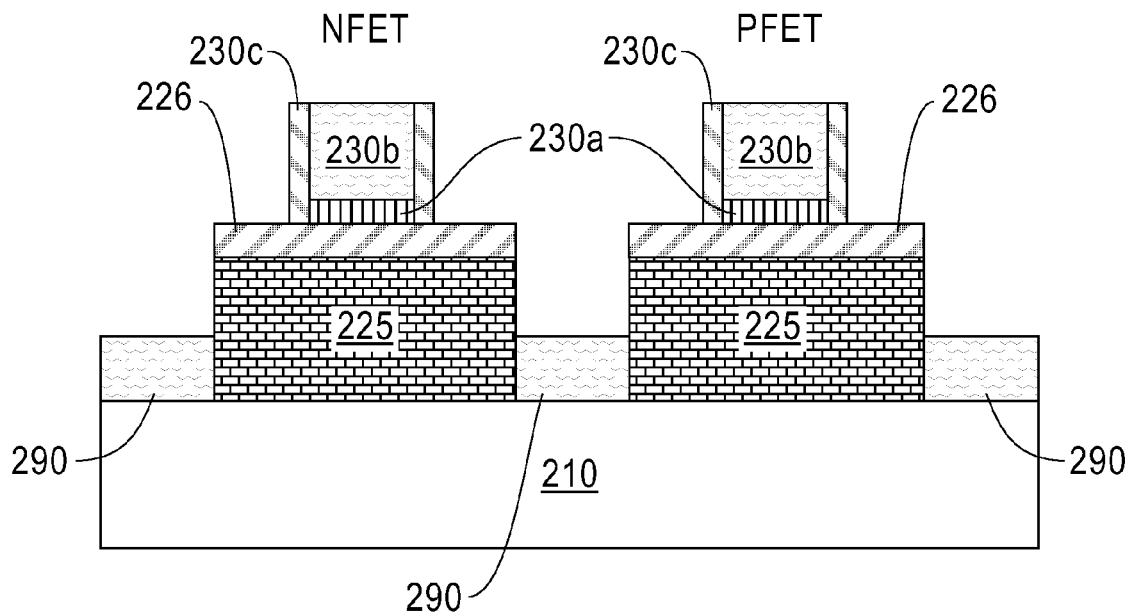
FIG. 4F shows etching the shallow trench isolations.

In FIG. 4E, the gates formations (230a, 230b, 230c) are then formed on the NFET and PFET region. Note that the gate formations are similar in the NFET and PFET region. In FIG.

Figure 4G:
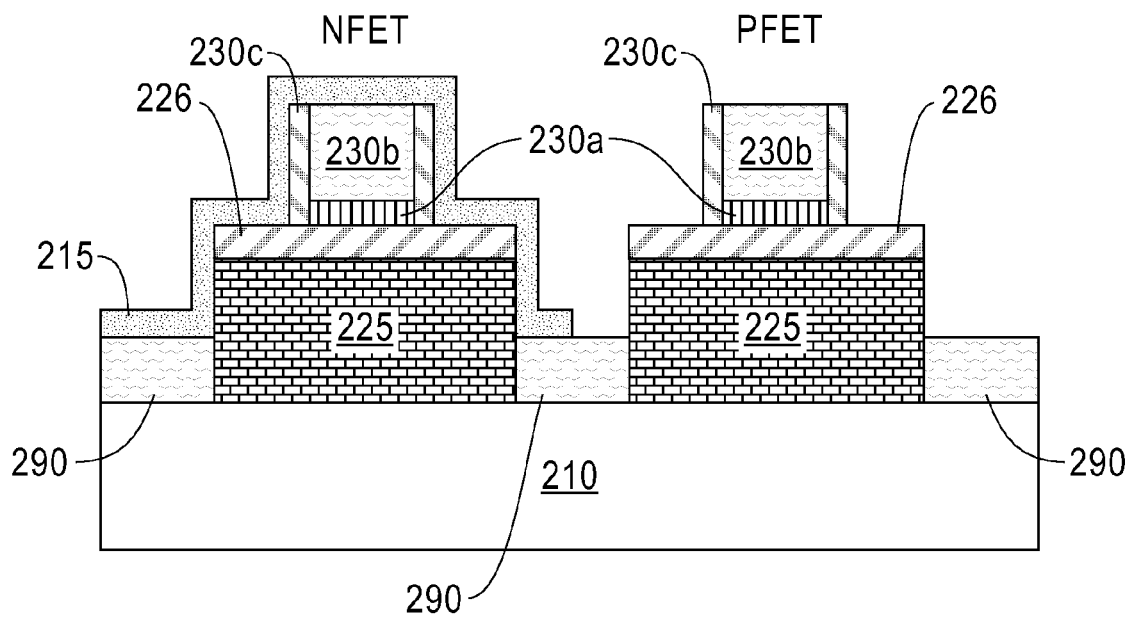
FIG. 4G shows a masking layer on the NFET region and shallow trench isolations.
Figure 4H:
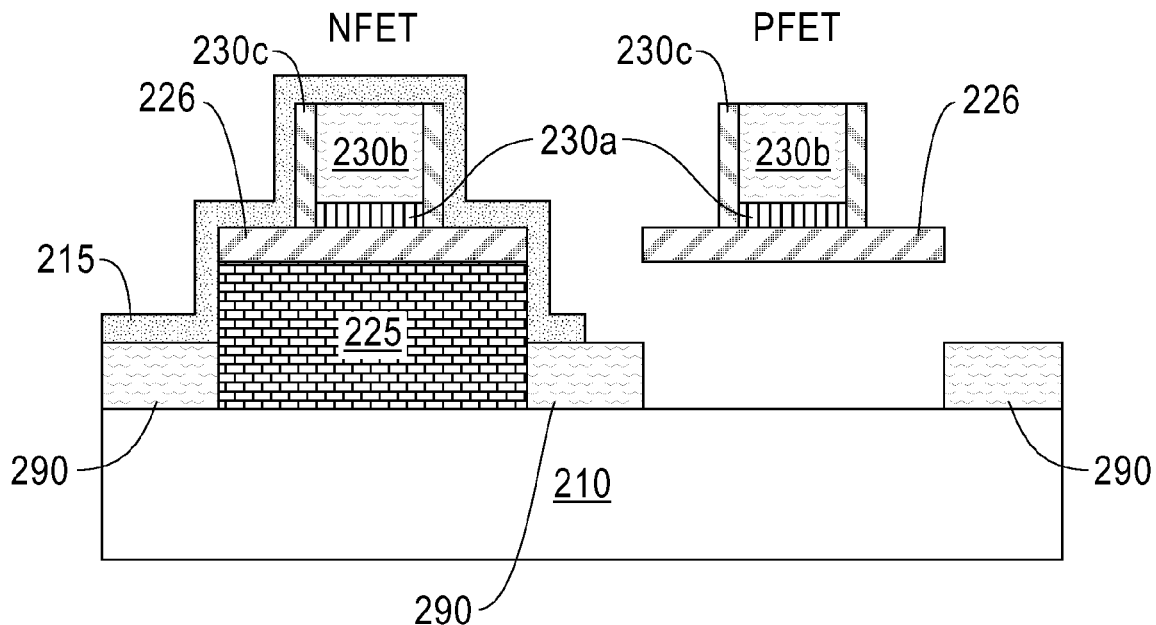
FIG. 4H shows the removal of the SiGe layer.
Figure 4I:
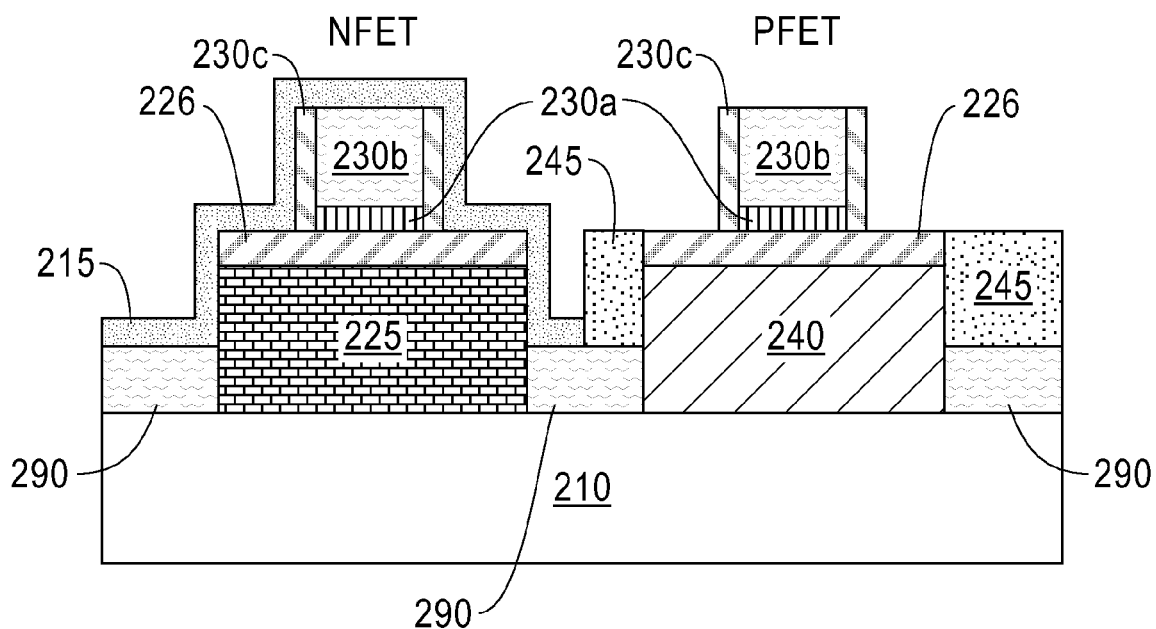
FIG. 4I shows the deposit of the insulating layer on the PFET region and the shallow trench isolation.
Figure 4J:
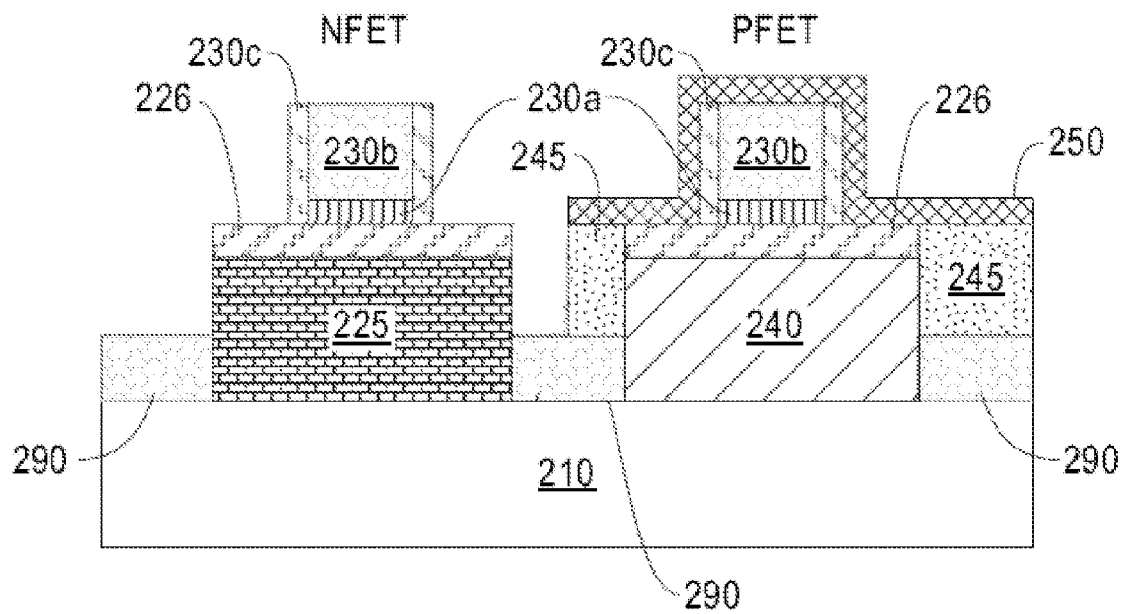
FIG. 4J shows the masking of the PFET region to repeat the process on the NFET region.

4F, the shallow trench isolations (220a, 220b, 220c) are further recessed to a depth range of 15 nm to 80 nm. In FIG. 4G, a hard mask (215) is applied to the top surface and is etched away in the PFET region to protect the NFET region. In FIG. 4H, the SiGe layer (225) in the PFET region is then removed. In FIG. 4I, the air gap is then filled with the insulator layer (240), which can be either compressively stressed nitride or compressively stressed oxide. The shallow trench isolations will also be filled with either an oxide or tensile stressed oxide (245). The fill will be flush with the top layer of the Si on the PFET region. In FIG. 4J, after removing the hard mask (215) on the NFET region, another mask (250) is then applied to the PFET region. The mask can either be a soft mask or a hard mask. The process then repeats for to implant the insulator in the NFET region.

Figure 4K:
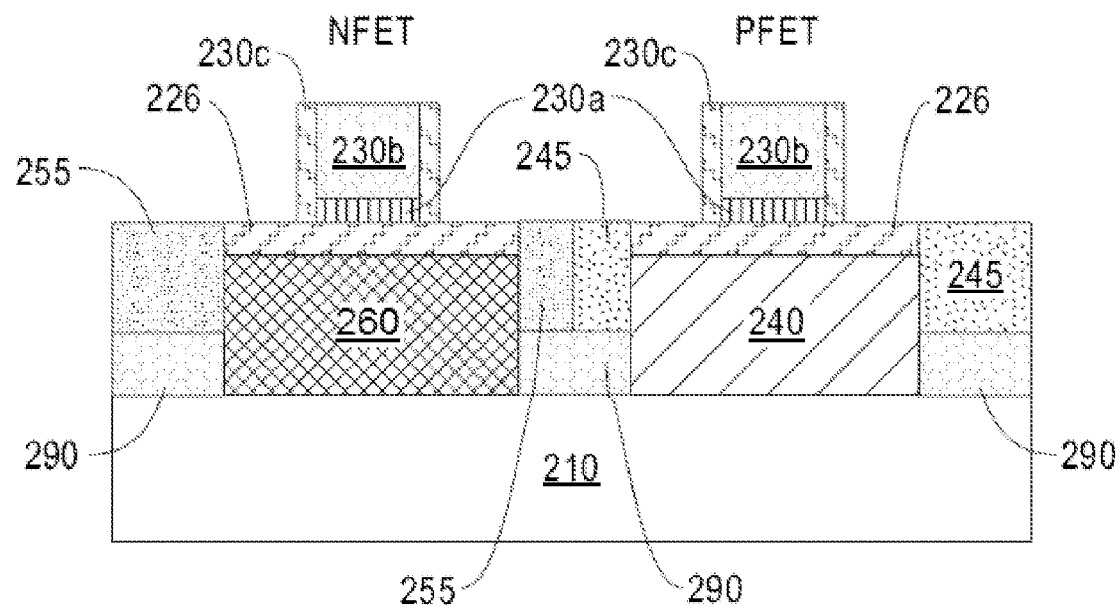
FIG. 4K shows the SOI single gate structure.

On the NFET region, the SiGe layer (225). Insulator layer (260) then fills the air gap where the SiGe layer (225) was removed. The insulator layer can be either a tensile stressed nitride or tensile stressed oxide. The shallow trench isolations will also be filled with either an oxide or compressive stressed oxide (255). The fill will be flush with the top layer of the Si on the PFET region. The mask on the PFET region is then removed, revealing the SOI dual stress buried insulator with single gate metal structure as shown in FIG. 4K.

Although the embodiments of the present invention have been described hereinabove, the present invention is not limited to the foregoing embodiments. The specific embodiments discussed are merely illustrative of specific ways to make and use the invention, and do not limit the scope of the invention.

The invention claimed is:

1. A method of forming a semiconductor device, the method comprising the steps of:
    providing a bulk substrate layer;
    forming shallow trench isolation regions in a substrate to isolate active regions for forming a first FET region and a second FET region;
    forming a hard mask over said second FET region;
    recessing the bulk substrate layer in said first FET region;
    depositing a layer of silicon germanium (SiGe) in the recess of said first FET region;
    depositing a layer of silicon on top of said SiGe layer in the recess of said first FET region;
    forming a first gate dielectric layer on said first FET region and a first gate conductor formed atop of said first gate dielectric layer on said first FET region to form a first gate electrode structure;
    recessing the shallow trench isolation regions surrounding first FET region to the bottom of the layer of SiGe in the recess of the first FET region;
    removing the layer of SiGe in the recess of the first FET region, which creates a first air gap;
    filling said first air gap with an insulator layer comprising either stressed oxide or stressed nitride, wherein the insulator layer is either tensile stressed or compressive stressed;
    filling said recessed shallow trench isolation regions surrounding said first FET region with an oxide, such that an enhanced strain is applied to the first FET region;
    removing the hard mask from the second FET region;
    forming a second hard mask or a soft mask over the first FET region, wherein the first FET region includes the formed gate electrode structure and the gate conductor;
    recessing the bulk substrate layer in said second FET region;
    depositing a SiGe layer in the recess of the second FET region and depositing a silicon layer on top of said SiGe layer in the recess of the second FET region;
    forming a second gate dielectric layer on said second FET region and a second gate conductor formed atop of said second gate dielectric layer on the second FET device to form a second gate electrode structure;
    recessing said shallow trench isolation regions surrounding said second FET region to the bottom of the layer of SiGe in the recess of the second FET region;
    removing said layer of SiGe in the recess of the second FET region, which creates a second air gap;
    filling the recessed shallow trench isolation regions surrounding said second FET region with an oxide, such that an enhanced strain is applied to the second FET region; and
    removing the hard mask layer from the first FET region.

2. The method as in claim 1, wherein the step of filling the shallow trench isolation regions surrounding said first FET region and surrounding said second FET region further comprises the step of:
    filling the shallow trench isolation regions surrounding said first FET region with either a tensile stressed oxide or compressive stressed oxide; and
    filling the shallow trench isolation regions surrounding said second FET region with either a tensile stressed oxide or a compressive stressed oxide.

3. The method as in claim 1, wherein said first gate electrode structure comprises a high-k dielectric and gate metal and the second gate electrode structure comprises a different high-k dielectric and gate metal.

* * * * *